(12) United States Patent
Hirobe

(10) Patent No.: US 7,436,732 B2
(45) Date of Patent: Oct. 14, 2008

(54) INTERNAL POWER SUPPLY GENERATING CIRCUIT WITHOUT A DEAD BAND

(75) Inventor: Atsunori Hirobe, Tokyo (JP)

(73) Assignee: Elpida Memory, Inc., Tokyok (JP)

( * ) Notice: Subject to any disclaimer, the term of this patent is extended or adjusted under 35 U.S.C. 154(b) by 64 days.

(21) Appl. No.: 11/671,937

(22) Filed: Feb. 6, 2007

(65) Prior Publication Data

US 2007/0206427 A1   Sep. 6, 2007

(30) Foreign Application Priority Data

Feb. 7, 2006   (JP)   ............... 2006-029689

(51) Int. Cl.
   *G11C 5/14*   (2006.01)
(52) U.S. Cl. .................. 365/226; 365/189.09; 365/228
(58) Field of Classification Search ............ 365/189.09, 365/189.11, 189.08, 226, 190, 194, 228
   See application file for complete search history.

(56) References Cited

U.S. PATENT DOCUMENTS

| | | | |
|---|---|---|---|
| 5,901,102 A * | 5/1999 | Furutani | ............. 365/226 |
| 6,335,893 B1 | 1/2002 | Tanaka et al. | |
| 6,339,344 B1 | 1/2002 | Sakata et al. | |
| 6,366,506 B1 | 4/2002 | Mizuno et al. | |
| 6,392,951 B2 | 5/2002 | Fujima et al. | |
| 7,049,797 B2 | 5/2006 | Fukui et al. | |

FOREIGN PATENT DOCUMENTS

| | | |
|---|---|---|
| JP | 9-120675 A | 5/1997 |
| JP | 10-242815 A | 9/1998 |
| JP | 10-269771 A | 10/1998 |
| JP | 2000-58785 A | 2/2000 |
| JP | 2000-306382 A | 11/2000 |
| JP | 2001-110184 A | 4/2001 |
| JP | 2001-266573 A | 9/2001 |
| JP | 2004-133800 A | 4/2004 |
| WO | WO 98/58382 A1 | 12/1998 |

* cited by examiner

*Primary Examiner*—Son Dinh
*Assistant Examiner*—Hien N Nguyen
(74) *Attorney, Agent, or Firm*—Sughrue Mion, PLLC

(57) ABSTRACT

An internal power supply generating circuit has a control circuit for controlling a control node voltage of a driver circuit thereof. During an overdrive duration, the control node voltage is set at an appropriate level of an operation range by controlling the control node voltage by the control circuit. By setting the control node voltage at the appropriate level, the internal power supply generating circuit can supply an internal power-supply voltage without a dead band after the overdrive duration. With this structure, the internal power supply generating circuit without the dead band can be obtained and a semiconductor device operable at a high speed comprising the internal power supply generating circuit can be obtained.

21 Claims, 10 Drawing Sheets

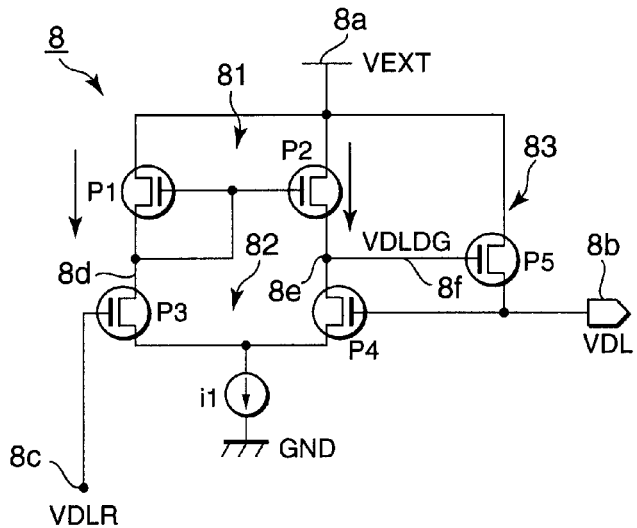
FIG. 3
PRIOR ART
FIG. 4A
PRIOR ART  WL
FIG. 4B  SAE
PRIOR ART
FIG. 4C  ODV
PRIOR ART
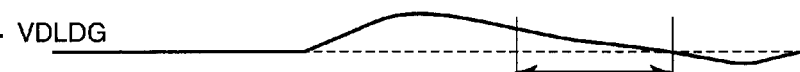
FIG. 4D
PRIOR ART  VDLDG
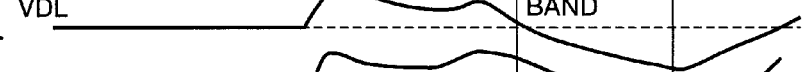
FIG. 4E  VDL
PRIOR ART
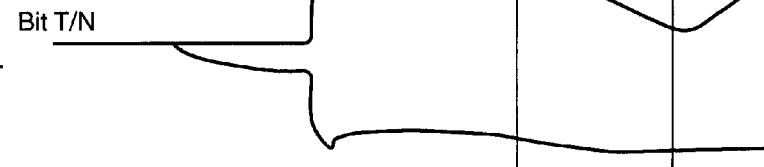
FIG. 4F  Bit T/N
PRIOR ART

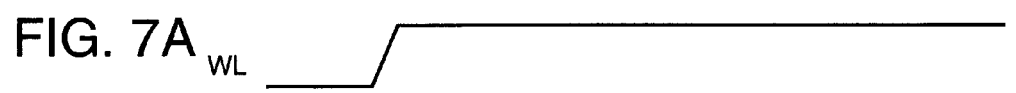
FIG. 7A WL
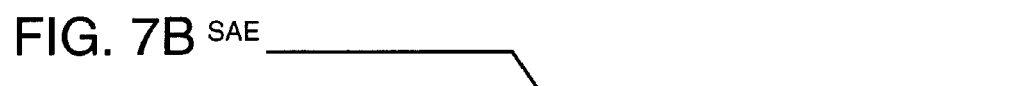
FIG. 7B SAE
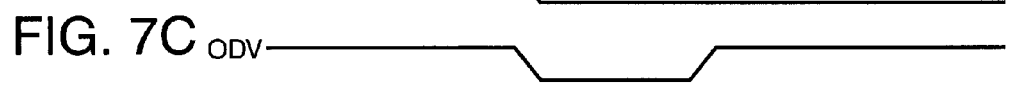
FIG. 7C ODV
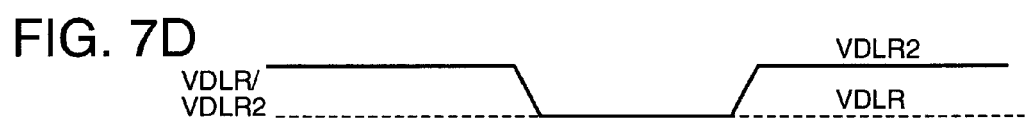
FIG. 7D VDLR/VDLR2
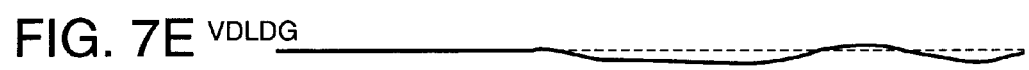
FIG. 7E VDLDG
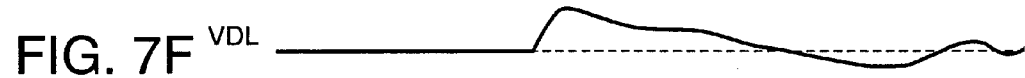
FIG. 7F VDL
FIG. 7G Bit T/N

WL

SAE

ODV

VDLR          VDL

VDL 06

VDL 07

VDLDG

VDL

Bit T/N

INTERNAL POWER SUPPLY GENERATING CIRCUIT WITHOUT A DEAD BAND

This application claims priority to application JP 2006-29689, the disclosure of which is incorporated herein by reference.

BACKGROUND OF THE INVENTION

This invention relates to a semiconductor device and, in particularly, to an internal power supply generating circuit for generating an internal power-supply voltage on the basis of an external power-supply voltage supplied from an outside and a semiconductor device comprising the same.

In resent year, high-speed and low power consumption are facilitated in semiconductor devices. For this purpose, the semiconductor device comprises an internal power supply generating circuit for generating an internal power-supply voltage VDL into which an external power-supply voltage supplied from outside is step-down and semiconductor device uses the internal power-supply voltage VDL as a high level of a small amplitude signal. For example, in semiconductor memory devices, the internal power-supply voltage VDL is generated as a voltage which is lower than the external power-supply voltage VEXT by a predetermined value. The internal power-supply voltage VDL is used as a voltage for writing data in a memory cell or a high level of a bit lines reading signal. Therefore, the internal power-supply voltage VDL is called an array power-supply voltage. Data transfer around a memory array is carried out at VDL/GND level serving as a power supply voltage having a small amplitude. In the manner which is described above, by making an signal amplitude of data small and by suppressing generation of noises, a high-speed data transfer has been allowed.

Although the high-speed of transfer rate is accomplished by making the signal amplitude of data small, it is disadvantageous in that an initial operation in reading-out/writing-in operations becomes slow. By resolving this problem, an overdrive reading-out method and an overdrive writing-in method are adopted in the semiconductor memory devices. The overdrive reading-out method makes a power-supply voltage applied to a sense amplifier high at an initial stage of the reading-out operation. On writing-in operation, if an input writing-in signal has a small amplitude, it is lacking in the ability to invert a signal between bit lines pair and a writing-in time becomes longer. For this purpose, the overdrive writing-in method supplies the sense amplifier with the external power-supply voltage VEXT at an initial stage of the writing-in operation. In the manner which is described above, inasmuch as a power-supply amplitude (VEXT/GND) larger than a signal amplitude (VDL/GND) is supplied to the sense amplifier, the overdrive reading-out method and the overdrive writing-in method are collectively called an overdrive method.

Various overdrive methods are already known. By way of example, a patent document 1 (Japanese Unexamined Patent Publication of Tokkai No. Hei 10-269,771 or JP-A 10-269771) discloses a technique idea for setting a suitable overdrive duration regardless of process variations. The patent document 1 discloses a semiconductor memory device comprising a sense amplifier for amplifying a signal produced between a complementary bit lines pair from a memory cell in synchronism with a sense amplifier drive signal, a common source lines pair for supplying the sense amplifier with a power supply voltage for operating it, overdrive transistors for overdriving the sense amplifier by extending a potential difference between the common source lines pair than a normal level only for a predetermined time internal from an operation start timing of the sense amplifier, and an overdrive pulse generating circuit for an overdrive pulse for controlling drive of the overdrive transistors. The overdrive pulse generating circuit includes a delay circuit for determining a pulse width of the overdrive pulse or the overdrive duration. In the patent document 1, by matching a gate length of a transistor constituting the delay circuit with a gate length of the overdrive transistors, process variations and manufacturing variations of an MOS transistor and are compensated. However, even in the same chip, there is a difference in design requirement between the overdrive transistors for use in the memory array and the transistor composing of the delay circuit for use in a peripheral control portion. To compensate the variations at the gate length as the same MOS transistor results in impairing design efficiency because the design requirement is generally matched with a reduced peripheral requirement. In addition, the overdrive method disclosed in the patent document 1 is deficient as a control method of the overdrive dependent on the external power-supply voltage.

Furthermore, a patent document 2 (Japanese Unexamined Patent Publication of Tokkai No. Hei 9-120,675 or JP-A 9-120675) and a patent document 3 (Japanese Unexamined Patent Publication of Tokkai No. Hei 10-242,815 or JP-A 10-242815) disclose a compensating method of the overdrive dependent on the external power-supply voltage.

The patent document 2 discloses a semiconductor integrated circuit which is capable of preventing an excessive overdrive even when a power supply voltage fed to a sense amplifier is high. The semiconductor integrated circuit disclosed in the patent document 2 includes a control circuit for supplying an operation power supply to a sense amplifier. The control circuit supplies, as the operation power supply, a power supply voltage (VDD) to the sense amplifier at an activation timing of the sense amplifier based on a first control signal which is initially activated, and then supplies, as the operation power supply, a step down voltage (VDL) having lower level than the power supply voltage to the sense amplifier based on a second control signal which is successively activated. The control circuit includes a delay circuit for determining an overdrive time interval between a time instant when the first control signal is activated and a time instant when the second control signal is activated. The control circuit includes an inverter circuit which is operable with the power supply voltage (VDD). The delay circuit has a delay time interval with negative dependency on the power supply voltage. However, in the patent document 2, a dependent relationship between the delay time interval and the power supply voltage (VDD) is restricted to characteristics of inverter elements constituting the inverter circuit.

The patent document 3 discloses a pulse generating circuit for use in a semiconductor device which is operable with an internal power-supply voltage ($V_{INT}$) into which an external power-supply voltage (Vcc) is stepped down. The pulse generating circuit comprises a Vcc delay circuit, a $V_{INT}$ delay circuit, and a logical operation circuit. The Vcc delay circuit comprises a plurality of Vcc delay elements in a cascade connection fashion each of which consists of a CMOS inverter where a p-channel transistor has a source and a substrate both of which are supplied with the external power-supply voltage. The $V_{INT}$ delay circuit comprises a plurality of $V_{INT}$ delay elements in a cascade connection fashion each of which consists of a CMOS inverter where a p-channel transistor has a source supplied with the internal power-supply voltage and a substrate supplied with the external power-supply voltage. The logical operation circuit carries out logical operation on an output of the Vcc delay circuit and an output of the $V_{INT}$ delay circuit to generate a pulse. It will be assumed that the Vcc delay circuit comprises the Vcc delay elements consisting of 6-stage CMOS invertors while the $V_{INT}$ delay circuit comprises the $V_{INT}$ delay elements consisting of 2-stage CMOS invertors and the internal power-supply voltage $V_{INT}$ is equal to 2.5 volts. In this event, the Vcc delay circuit has a delay time interval which is equal to about 4 nanoseconds when the external power-supply voltage Vcc is equal to 3 volts and which is equal to about 3 nanoseconds when the external power-supply voltage Vcc is equal to 3.5 volts. On the other hand, the $V_{INT}$ delay circuit has a delay time interval which is equal to about 1.5 nanoseconds when the external power-supply voltage Vcc is equal to 3 volts and which is equal to about 1.8 nanoseconds when the external power-supply voltage Vcc is equal to 3.5 volts. The dependency is accelerated by a difference between the delay time interval of the Vcc delay circuit having a positive dependency on the external power-supply voltage Vcc and the delay time interval of the $V_{INT}$ delay circuit having a negative dependency on the external power-supply voltage Vcc.

Each of a patent document 4 (Japanese Unexamined Patent Publication of Tokkai No. 2000-058,785 or JP-A 2000-058785) and a patent document 5 (Japanese Unexamined Patent Publication of Tokkai No. 2001-266,573 or JP-A 2001-266573 which corresponds to U.S. Pat. No. 6,392,951) describes an overdrive on sensing a sense amplifier.

The patent document 4 discloses a dynamic type RAM which is capable of raising speed and of reducing a chip area. The dynamic type RAM disclosed in the patent document 4 comprises an N-channel type first power switch MOSFET, an N-channel type second power switch MOSFET, and an N-channel type third power switch MOSFET The N-channel type first power switch MOSFET supplies an over-drive voltage to a common source line. The N-channel type second power switch MOSFET supplies an internal high-voltage to the common source line. The N-channel type third power switch MOSFET supplies a ground voltage for a circuit to the common source line. The N-channel type first and third MOSFETs are distributed in an intersection region which the N-channel type second MOSFET is allocated apart in an indirect peripheral circuit on both or single side outside a memory array.

The patent document 5 discloses a semiconductor storage device in which drive of each sense means is not boosted unnecessarily even when a voltage generating means generating a voltage being higher than a predetermined driving voltage for a predetermined time interval from a sense start time instant is shared by a plurality of sense means. The semiconductor storage device disclosed in the patent document 6 includes sense amplifier rows for receiving a common sense amplifier drive voltage supplied by an internal voltage driver having a high current source mode. The semiconductor storage device may include banks of memory cells, row decoders, bank enable generation circuits, sense amplifier rows, sense amplifier drivers, sense amplifier control circuits, and internal voltage drivers. The internal voltage driver can include a high current source or high voltage mode, which can be received by a sense amplifier row during predetermined initial sense period. Other sense amplifier rows having already sensed data can be isolated from the internal voltage driver during the high current source or the high voltage source mode.

In general, in order to regulate the overdrive time interval, a delay element composed of a plurality of inverter elements is used. The delay element has a VDD dependency resolving an inverter characteristic and it is therefore difficult to make the delay element have the VDD dependency which is higher than that defined by the inverter characteristic. In addition, the overdrive time interval is regulated within an operational range of an ordinary product so that the VDD voltage satisfies a characteristic at a low side. Furthermore, in a case where a high-speed sensing characteristic is required, it generally demonstrates a propensity to make the overdrive time interval longer. Therefore, over-charging easily occurs at a high side of the VDD voltage. Conversely, when the overdrive time interval is regulated at the high side of the VDD voltage, it is short of the overdrive time interval at a low side of the VDD voltage, a high-speed operation is not good enough, and results in restricting a produce characteristic itself.

As an internal power supply generating circuit for generating an internal power-supply voltage on the basis of an external power-supply voltage supplied from outside, the following patent documents are known. A patent document 6 (Japanese Unexamined Patent Publication of Tokkai No. 2004-133,800 or JP-A 2004-133800 corresponding to U.S. Pat. No. 7,049,797) discloses a semiconductor integrated circuit device having a pair of voltage step-down power supply circuits for active and standby conditions. In the semiconductor integrated circuit device, a first reference voltage is formed by amplifying a fixed voltage formed in a fixed voltage generating circuit with an amplifying circuit which can adjust the voltage gain having a resistance circuit and a switch controlled with a first trimming switch setting signal. An internal step-down voltage, which the internal circuit is in the active condition, is outputted from a first output buffer, which is activated with a first control signal. A second reference voltage is formed by adjusting a combination of threshold voltages of MOSFETs and a switch controlled with a second trimming switch setting signal. An internal step-down voltage, when the internal circuit is in the standby condition, is outputted with a second output buffer, which is activated with a second control signal.

A patent document 7 (WO1998/058382 corresponding to U.S. Pat. No. 6,335,893) and a patent document 8 (Japanese Unexamined Patent Publication of Tokkai No. 2001-110,184 or JP-A2001-110184 corresponding to U.S. Pat. No. 6,366,506) disclose a power supply circuit which is capable of suppressing variations of a power supply voltage by stepping down an external power-supply voltage after stepping up the external power-supply voltage.

The patent document 7 discloses a semiconductor integrated circuit device comprising a first circuit block operating on a power supply voltage supplied through an external terminal and a second circuit block operating on an internal voltage generated by a power supply circuit. A voltage having an absolute value greater than that of the internal voltage is generated by a charge pump circuit. Variable impedance means is provided between the output voltage of the charge pump circuit and the internal voltage. A reference voltage and the internal voltage are compared by a differential amplifier circuit operating on the output voltage generated by the charge pump circuit. The variable impedance means is controlled such that those voltages agree with each other.

The patent document 8 discloses a semiconductor device which is capable of providing a supply means of an internal power-supply voltage being stable and flexible by solving a problem of supply of an operation power supply caused corresponding to drop of an external power-supply voltage externally supplied. The semiconductor device disclosed the patent document 8 comprises a first circuit block supplied with a first operating voltage, a second circuit block supplied with a second operating voltage, a voltage generating circuit for generating a third operating voltage in response to the first operating voltage, and a third circuit block supplied with the third operating voltage. Preferably, the third operating voltage is increased to a fourth operating voltage by a voltage-up converter, and then the fourth operating voltage is dropped to the third operating voltage by a voltage down-converter. Hence, a power supply operating internally stably in spite of use of a relatively fluctuating voltage can be provided even in the case of where a power-supply voltage is dropped. The patent document 8 discloses, in FIG. 5 thereof, a voltage down-converter comprising first and second voltage limiter circuits for generating reduced voltages corresponding to reference voltages by negative feedback operations respectively. Each of the first and the second voltage limiter circuit includes an operational amplifier constituted by a differential amplifier, and an output P-channel MOS with a gate controlled by the output of the differential amplifier. The first voltage limiter circuit converts the level of the reference voltage. The first voltage limiter circuit receives the reference voltage generated by a reference voltage generating circuit and generates a second reference voltage equal to a desired internal voltage by comparing the reference voltage with a tap voltage at a junction between resistors. The second reference voltage is a voltage substantially equal to a word line drive voltage. The first voltage limiter circuit is used because a voltage equal to the word line drive voltage can be hardly directly generated by the circuit for the reference voltage. If a voltage equal to the internal voltage can be generated directly from the reference voltage, the first voltage limiter circuit may be omitted so that the reference voltage generating circuit is directly connected to the second voltage limiter circuit as an internal voltage output buffer. The differential amplifiers and the output MOSs are provided to operate with a boosted voltage.

In addition, a patent document 9 (Japanese Unexamined Patent Publication of Tokkai No. 2000-306,382 or JP-A 2000-306382 corresponding to U.S. Pat. No. 6,339,344) discloses an input circuit which is capable of input levels having a large amplitude and a small amplitude. Specifically, the patent document 9 discloses a semiconductor integrated circuit device which realizes a low power consumption by supplying both a first-amplitude input signal and a second-amplitude input signal to a differential amplifier circuit. The first-amplitude input signal corresponds to a first operating voltage and a second operating voltage which are supplied respectively from a first MOSTFET and a second MOSFET. The second-amplitude input signal corresponds to a prescribed intermediate voltage between the first operating voltage and the second operating voltage. The patent document 9 discloses, in FIG. 2 thereof, an input circuit including a differential amplifier circuit. The differential amplifier circuit is constituted by connecting P-channel load MOSFETs in the form of a current mirror to the drain side of N-channel differential MOSFETs that are served with an input voltage and a reference voltage through the gages thereof, and by providing an N-channel current-source MOSFET on the common source side through an N-channel switching MOSFET. The current-source MOSFET is served with a ground potential of the circuit through the source thereof and is served with a constant voltage through the gate thereof. A P-channel switching MOSFET is provided between a power supply voltage and the common source of the P-channel load MOSFETs in the form of the current mirror.

In the manner which is described above, a power-supply voltage for an internal circuit is decreased while an overdrive method is used. This reason is necessary on manufacturing semiconductor devise. In this day and age, a device composed of the semiconductor device is moved their processed to finer design rules and is improved economy of scale for high integration and large capacity. A finer designed device has naturally a lowered withstand voltage. On the other hand, it is impossible to decrease a threshold voltage (Vt) of a transistor in proportion to the internal power-supply voltage in light of a leak characteristic of the transistor. For this purpose, a normal operation is activated by a low voltage and an initial operation only is activated by a high voltage using the overdrive method or a overcharging method. In the manner which is described above, a high-speed operation is realized by rising the voltage at the initial operation.

For example, a reading operation (a sensing operation) of memory cell data in a dynamic RAM (random access memory) uses an internal power-supply voltage VDL stepped down from an external power-supply voltage VEXT for a memory cell array. However, an initial sensing operation uses the external power-supply voltage VEXT by using the overdrive method. The overdrive methods are classified into an overcharging method of shorting the external power-supply voltage VEXT and the internal power-supply voltage VDL and an overdrive method of making an output of the internal power-supply voltage VDL the external power-supply voltage. In the manner which is described above, in the initial sensing operation, the external power-supply voltage due to the overdrive method is used. However, this inventor finds a problem in the overdrive methods to attain this invention. The problem lies in that the overdrive is carried out by the external power-supply voltage VEXT higher than the internal power-supply voltage in an initial operation duration for an sense amplifier.

Now, the description will proceed to the problem in the overdrive methods.

Data read out of the memory cell is sense-amplified as a minute difference voltage based on a reference voltage in the sense amplifier. In general, the reference voltage is substantially equal to a voltage HVCC which is half of the internal power-supply voltage VDL. In the initial operation for the sense amplifier, it is possible to carry out the sensing operation at a high speed by raising the internal power-supply voltage by using the overdrive method or the overcharging method. For instance, it will be presumed that the memory cell data is cell high (H) data higher than the voltage HVCC. In this event, an initial amplification is started by turning an N-channel transistor in the sense amplifier at a low voltage side on and successively a P-channel transistor in the sense amplifier at a high voltage side is turned on, and then the memory cell data is amplified. In order to carry out supply of electrical charges from the internal power-supply voltage VDL at a high speed because the P-channel transistor is turned on, the overdrive or the overcharging is carried out.

It is therefore possible to carry out high-speed operation for specs such as tRAS spec. In this event, an amount of electrical charges to be supplied remains unchanged although the read-out data is the cell high (H) data or is the cell low (L) data. This reason will be described as follow.

It will be assumed that a bit line where a selected cell is connected is called "TRUE(T) side bit line" while a bit line where the selected cell is not connected is called "NOT(N) side bit line." When the memory cell data is the cell high (H) data, almost of the memory cells of 99% maintain the voltage VDL on be refreshed in a case where the memory cells are refreshed within a spec refresh interval. Accordingly, the cell potential does not change before and after refreshing and a potential between a bit line pair changes from the voltage HVCC to the voltage VDL alone. When the memory cell data is the cell high (H) data, the TRUE side bit line is charged from the voltage HVCC to the VDL. When the memory cell data is the cell low (L) data, a potential on the NOT side bit line changes from the voltage HVCC to the voltage VDL. That is, an amount of the electrical charges to be changed is the same but a difference occurs in a charging speed thereof.

At first, a capacitance to be changed is a sum of a bit line capacitance Cd and a cell capacitance Cs on the TURE side bit line when the memory cell data is the cell high (H) data. The capacitance to be changed is the bit line capacitance Cd only on the NOT side bit line when the memory cell data is the cell low (L) data. In addition, a voltage on staring the charging is equal to the voltage HVCC at the NOT side bit line (the cell L) and is equal to a voltage (HVCC+VR) at the TURE side bit line (the cell H), where VR represents a read-out potential from the memory cell. In a memory in recent times, the ratio of the bit line capacitance Cd to the cell capacitance Cs becomes smaller such as 4:1 to 3:1. Therefore, there is a difference of 20% to 25% in the capacitance to be changed between the TRUE side bit line (the cell H) and the NOT side bit line (the cell L) and a difference of 20% to 25% occurs in the voltages to be charged.

Due to this capacitance and this voltage difference, a difference occurs in the charging speed and a charging time interval up to a final voltage is different between the cell H and the cell L. In general, the charging P-channel transistor in early amplification has a drain-source voltage Vds of the NOT side higher than a drain-source voltage Vds of the TRUE side and has a large charging capacity. Inasmuch as the charging capacity and the capacitance to be charged are small, the potential on the NOT side bit line quickly overtakes a high level on the TURE side bit line. In the latter half of amplification, there is hardly a voltage difference between the voltage on the NOT side bit line and the voltage on the TRUE side bit line and there is no difference in the charging capacity of the transistor. Inasmuch as there is a capacity difference, the voltage on the NOT side bit line having a small capacity reaches to the voltage VDL earlier than the voltage on the TRUE side bit line. In the manner which is described above, although it becomes inescapable that there is a difference in the charging speed in dependent on H/L of the cell data, the semiconductor memory devices are designed so that there is no final voltage difference between both. In the description as follows, the description will be made on the assumption that the charging speed in the cell low (L) data is fast.

In the manner which is described above, although necessary electrical charges dependent on H/L of the cell data are equal to each other, there is a difference between the charging time intervals thereof. Accordingly, in the overdriving and the overcharging required in operation at the low voltage, control must be made so that an amount of the necessary electrical charges is not exceeded. However, under the current circumstances, a circuit configuration using the overdriving and the overcharging uses the external power-supply voltage VEXT. Therefore, a supply amount of the electrical charges due to the overdriving and the overcharging seriously has a dependence on a change in the external power-supply voltage VEXT.

It will be assumed that the external power-supply voltage VEXT is high. In this event, an excessive supply of electrical charges is carried out in the latter pattern and the internal power-supply voltage VDL does to back to an original level at a sensing end. Therefore, over step-up of the internal power-supply voltage VDL becomes issue. Conversely, it will be assumed that the external power-supply voltage VEXT is low. In this event, electrical charges to be supplied is less at the former pattern, sufficient overdriving is not carried out, and a sufficient restoring is not carried out in regard to the tRAS spec. In addition, if the electrical charges to be supplied is less at the letter pattern, turning-on of N-channel and P-channel transistors in the sense amplifier SA is late and unattainable tRCT characteristic and malfunction of the sense amplifier occur.

In addition, although the sensing is carried out in safety, the sense amplifier does not sufficiently carry out amplification on tRCD minimum spec of a high-speed sense characteristic. Although a column selection switch YSW is opened in this state, electrical charges to be supplied to an 10 data line is clearly smaller than that on the cell high (H) sensing. Therefore, a problem of data error sensing comes up in a data amplifier and it results in malfunctioning of the cell high (H) caused by the data amplifier. Accordingly, in the overcharging and the overcharging, it is necessary to have means for suitably controlling intensity thereof. However, in this day and age, with finer design rules, there are a lot of parameters outside a scaling rule, and it is difficult to carrying out sufficient control. Therefore, this invention is proposed in terms of power control means as further improvement means.

In the manner which will later be described in conjunction with FIGS. 1 through 4 in detail, a conventional internal power-supply generating circuit has a duration where the internal power-supply generating circuit cannot respond that is called a VDL dead band.

When there is the VDL dead band, the current supply is not carried out by an overdrive power supply and the internal power supply generating circuit and a high power-supply voltage (SAP) of the sense amplifier decreases heavily. As a result, the amplified voltage difference between the bit line pair reduces and a sense time interval becomes longer. Alternatively, a malfunction of the sense amplifier occurs. In the manner which is described above, when the overdrive is carried out at the output of the internal power supply generating circuit, the dead band where the internal power supply generating circuit does not operate occurs at a time when the overdrive comes to an end. It is therefore disadvantageous in that the access time interval becomes longer or the malfunction of the sense amplifier occurs. Accordingly, it is necessary for the internal power supply generating circuit used in the overdrive method to have structure where the dead band does not occur or to have means for suitably controlling the dead band. However, the above-mentioned prior art patent documents 1 to 9 neither describe nor understand a problem for the dead band in the internal power supply generating circuit that is founded by the present inventor. Accordingly, inasmuch as the problem is not understood, the above-mentioned prior art patent documents 1 to 9 never teach technique for resolving the problem.

SUMMARY OF THE INVENTION

It is an object of this invention to provide an internal power supply generating circuit without a VDL dead band.

Other objects of this invention will become clear as the description proceeds.

According to an aspect of this invention, an internal power supply generating circuit is for generating an internal power-supply voltage from an external power-supply voltage. The internal power supply generating circuit comprises a current mirror circuit, a differential amplifying circuit, a driver circuit, and a control circuit. The current mirror circuit has an external input terminal supplied with the external power-supply voltage. The current mirror circuit has a pair of mirror output nodes. The differential amplifying circuit is connected to the pair of mirror output terminals. The differential amplifying portion has a reference input terminal supplied with a reference voltage and an internal output terminal for producing the internal power-supply voltage. The driver circuit is connected between the external input terminal and the internal output terminal. The driver circuit has a driver control node connected to the current mirror circuit. The control circuit is connected to the driver control node. The control circuit is for controlling variations of a voltage at the driver control node.

BRIEF DESCRIPTION OF THE DRAWING

FIG. 3 is a circuit diagram of a conventional primary internal power supply generating circuit for use in the periphery of the sense amplifiers illustrated in FIG. 2;

FIGS. 4A through 4F show waveforms for use in describing operation of the conventional primary internal power supply circuit illustrated in FIG. 3;

FIGS. 7A through 7G show waveforms for use in describing operation of the primary internal power supply generating circuit illustrated in FIG. 6;

DESCRIPTION OF THE PREFERRED EMBODIMENTS

Figure 1:
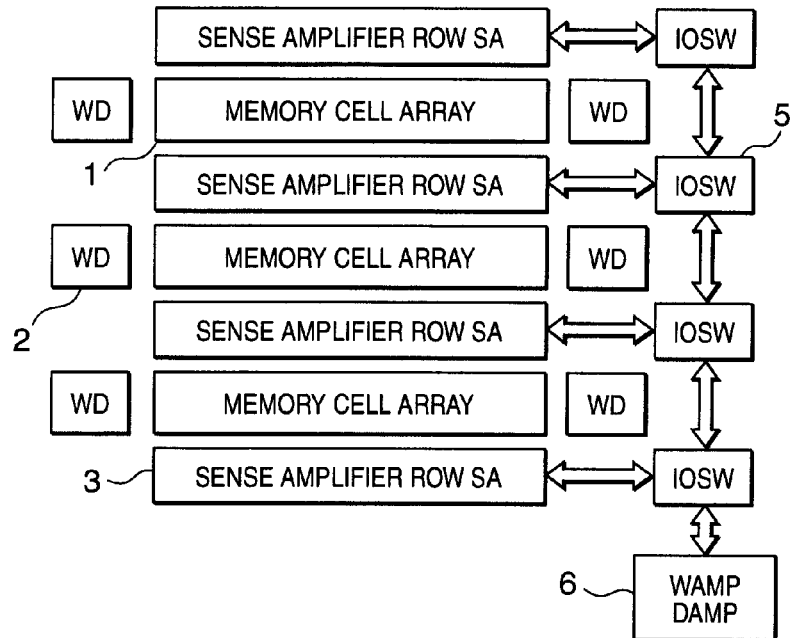
FIG. 1 is a schematic view of a conventional semiconductor memory device.
Figure 2:
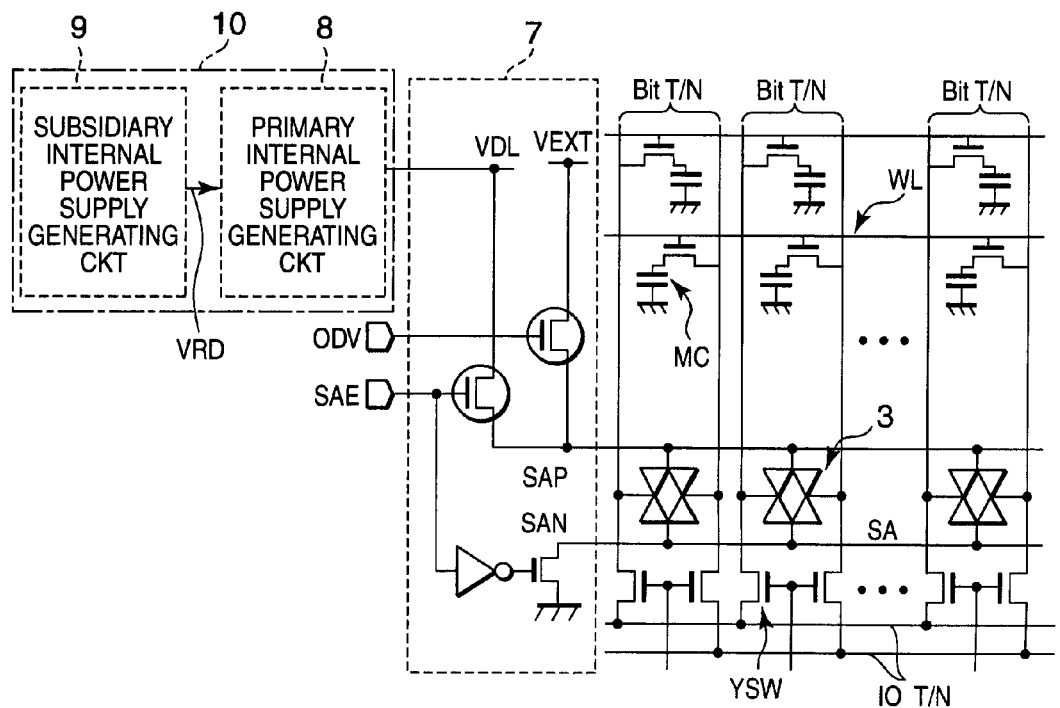
FIG. 2 is a schematic view of the periphery of sense amplifiers for use in the semiconductor memory device illustrated in FIG. 1.
Figure 5:
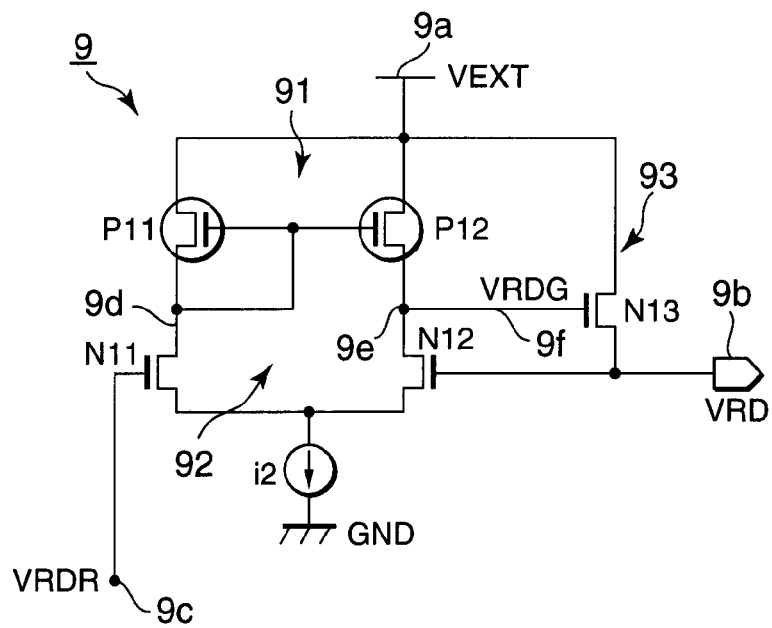
FIG. 5 is a circuit diagram of a conventional subsidiary internal power supply generating circuit for use in the periphery of the sense amplifiers illustrated in FIG. 2.

Referring to FIGS. 1 through 5, the description will proceed to a conventional internal power supply device 10 at first in order to facilitate an understanding of an internal power supply generating device according to the present invention. FIG. 1 is a schematic diagram showing a semiconductor memory device. FIG. 2 is a schematic diagram showing a sense amplifier surrounding. FIG. 3 is a circuit diagram of a conventional primary internal power supply generating circuit 8 for generating an internal power-supply voltage VDL. FIG. 4 is a view showing waveforms for use in describing operation of the primary internal power supply generating circuit illustrated in FIG. 3. FIG. 5 is a circuit diagram of a conventional subsidiary internal power supply generating circuit 9 for generating a subsidiary internal power-supply voltage VRD.

As shown in FIGS. 1 and 2, the semiconductor memory device comprises a plurality of memory cell arrays 1, a plurality of word driver columns (WDs) 2, and a plurality of sense amplifiers rows (SAs) 3. The memory cell arrays 1 are surrounded with the word deriver columns 2 and the sensing amplifier rows 3. Each of memory cell arrays 1 comprises a plurality of memory cells in a matrix fashion. Each memory cell array 1 has a plurality of bit line pairs BitT/N and a plurality of word lines WL. Each of the sense amplifiers rows 3 comprises a plurality of sense amplifiers SA which are connected to the bit line pairs BitT/N. Each of the sense amplifiers SA is selected by a column selection switch YSW. The selected sense amplifier is connected to the outside via a complimentary IO data pair IOT/N. Each of the word driver columns 2 comprises a plurality of word drivers for driving the word lines WL. Inasmuch the semiconductor memory device comprises the plurality of memory arrays 1, data lines are arranged hierarchically, bit lines pairs BitT/N are selected by the column selection switches YSW to connect to the complimentary IO data pairs IOT/N. In addition, the complimentary IO data pairs IOT/N are selected by IO selection switches (IOSWs) 5 to connect to a write amplifier (WAMP) and a data amplifier (DAMP) which will later be called merely a write amplifier WAMP 6. In addition, thereinafter, the sense amplifier rows and the sense amplifiers are not differentiated and will be called merely sense amplifiers (SA) 3.

As shown in FIG. 2, the memory cells, each of which is depicted at MC, are arranged in the matrix fashion and each memory cell MC has a bit line pair BitT/N which is connected to the sense amplifier (SA) 3. The sense amplifier (SA) 3 comprises a flip-flop circuit consisting of two inverter circuits. The sense amplifier (SA) 3 is supplied from a sense amplifier power supply circuit 7 with a high power-supply voltage (SAP) and a low power-supply voltage (SAN). During an initial stage of activating of the sense amplifier 3, the sense amplifier (SA) 3 is supplied with, as the high power-supply voltage (SAP), an external power-supply voltage VEXT in response to an overdrive signal ODV. During a steady stage of activating of the sense amplifier 3, the sense amplifier (SA) 3 is supplied with, as the high power-supply voltage (SAP), the internal power-supply voltage VDL from the internal power supply generating device 10. Amplified by the sense amplifier 3, memory cell data is transferred to the IO data line pair IOT/N via the column selection switch YSW.

As shown in FIG. 2, the conventional internal power supply generating device 10 comprises the conventional primary internal power supply generating circuit 8 for generating the internal power-supply voltage VDL and the conventional subsidiary internal power supply generating circuit 9 for generating the subsidiary internal power-supply voltage as a reference voltage VRD. The subsidiary power supply generating circuit 9 is called a reference voltage generating circuit. Under the circumstances, the internal power-supply voltage VDL is called a primary internal power-supply voltage.

FIG. 3 shows the conventional primary internal power supply generating circuit 8 for generating the internal power-supply voltage VDL. The primary internal power supply generating circuit 8 comprises a current mirror circuit 81, a differential amplifying circuit 82, a driver circuit 83, and a constant current source i1. The primary internal power supply generating circuit 8 has an external input terminal 8a supplied with the external power-supply voltage VEXT, an internal output terminal for producing the internal power-supply voltage VDL and a reference input terminal 8c supplied with a reference voltage VDLR. The reference voltage VDLR is supplied from the subsidiary internal power supply generating circuit 9 as the subsidiary internal power-supply voltage VRD.

More specifically, the primary internal power supply generating circuit 8 comprises first through fifth transistors P1, P2, P3, P4, and P5. Each of the first through the fifth transistors P1 to P5 comprises a P-channel metal oxide semiconductor field effect transistor (MOSFET). The first and the second transistors P1 and P2 have first and second gates, respectively, which are connected to each other in common. The first transistor P1 has a first drain connected to the first gate. That is, the first and the second transistors P1 and P2 are composed of a pair of mirror transistors. In other words, the current mirror circuit 81 comprises the first and the second transistors P1 and P2. The first and the second transistors P1 and P2 have first and second sources, respectively, which are supplied with the external power-supply voltage VEXT from the external output terminal 8a. The second transistor P2 has a second drain. The current mirror circuit 81 has a pair of mirror output nodes 8d and 8d.

The third transistor P3 has a third gate supplied with the reference voltage VDLR from the reference input terminal 8c. The third transistor P3 has a third source connected to the first drain and the first gate of the first transistor P1. The first transistor P3 serves as a reference differential transistor. The fourth transistor P4 has a fourth source connected to the second drain of the second transistor P2. The fourth transistor P4 serves as a feedback differential transistor. The third and the fourth transistors P2 and P4 have third and fourth drains, respectively, which are connected to each other in common and which are grounded via the constant current source i1. That is, a combination of the third and the fourth transistors P3 and P4 serves as the differential amplifying circuit 82 connected to the pair of mirror output nodes 8d and 8e.

The fifth transistor P5 has a fifth gate which is connected to the second drain of the second transistor P2 and to the fourth source of the fourth transistor P4. The fifth transistor P5 has a fifth source supplied with the external power-supply voltage VEXT from the external input terminal 8a. The fifth transistor P5 has a fifth drain which is connected to the fourth gate of the fourth transistor P4 and to the internal output terminal 8b of the primary internal power supply generating circuit 8. The fifth transistor P5 serves as a driver transistor. That is, the fifth transistor P5 serves as the driver circuit 83 having a driver control node 8f.

The primary internal power supply generating circuit 8 generates the internal power-supply voltage VDL from the internal output terminal 8b.

When the internal power-supply voltage VDL becomes high, a source voltage of the fourth transistor P4 increases, the fifth transistor P5 is turned off to stop current supply. On the other hand, when the internal power-supply voltage VDL becomes low, the source voltage of the fourth transistor P4 decreases, current supply from the fifth transistor P5 becomes much to raise the internal power-supply voltage VDL. In the manner which is described above, it is possible to generate the internal power-supply voltage VDL as a constant voltage equal to the reference voltage VDLR.

Referring to FIGS. 4A through 4F in addition to FIG. 2, the description will proceed to operation of the primary internal power supply generating circuit 8 illustrated in FIG. 3.

As shown in FIG. 4A, it will be assumed that the selected word line WL is activated. In this event, a small voltage difference occurs in the bit line pair BitT/N caused by a high level or a low level of the memory cell data as shown in FIG. 4F. FIG. 4F shows waveforms of the bit line pair BitT/N near the sense amplifier 3 when the memory cell data have the low level. Responsive to the sense amplifier enable signal SAE and the overdrive signal ODV, the sense amplifier 3 is supplied with a high power-supply voltage (SAP) and a low power-supply voltage (SAN), as shown in FIGS. 4B and 4C. As the high power-supply voltage (SAP), the external power-supply voltage VEXT is supplied to the sense amplifier 3 in response to the overdrive signal ODV. As the low power-supply voltage (SAN), a ground voltage GND is supplied with the sense amplifier 3.

Supplied with the high power-supply voltage (SAP) and the low power-supply voltage (SAN), the sense amplifier 3 sharply increases the voltage difference between the bit line pair BitT/N. Although a voltage level of the high power-supply voltage (SAP) raises toward the external power-supply voltage VEXT but does not reaches to the external power-supply voltage VEXT because the sense amplifier 3 is supplied with the current. In this event, the internal power-supply voltage VDL at the internal output terminal 8b is higher than a desired output voltage depicted at a broken line in FIG. 4E. In addition, the driver control node 8f in the primary internal power supply generating circuit 8 has a driver control voltage VDLDG higher than an adequate voltage depicted at a broken line in FIG. 4D because a current flowing through the fourth transistor P4 becomes small or the fourth transistor P4 is turned off. Inasmuch as the driver control node 8f has the driver control voltage VDLDG higher than the adequate voltage, the driver transistor P5 in the primary internal power supply generating circuit 8 is put into an off state. Therefore, the current supply is carried out by the external power supply alone during an overdrive duration.

At a time when amplification of the bit line pair BitT/N approximately reaches completion, the overdrive signal ODV is not activated as shown in FIG. 4C and the current supply from the external power supply makes a stop. Accordingly, the internal power-supply voltage VDL at the internal output terminal 8b decreases. However, inasmuch as the driver control node 8f in the primary internal power supply generating circuit 8 has the driver control voltage VDLDG higher than the adequate voltage as shown in FIG. 4D, the driver transistor P5 in the primary internal power supply generating circuit 8 is put into the off state and it is impossible to supply the current. Therefore, the internal power-supply voltage VDL at the internal output terminal 8b sharply decreases as shown in FIG. 4E. When the driver control voltage VDLDG at the driver control node 8f decreases to recover to the adequate voltage, the driver transistor P5 in the primary internal power supply generating circuit 8 is barely put into an on stage and the current is supplied from the primary internal power supply generating circuit 8. In the manner which is described above, there is a duration where the internal power supply generating circuit 8 cannot respond even though the overdrive makes a stop and the current supply from the primary internal power supply generating circuit 8 is expected. This duration is defined as a VDL dead band.

When there is the VDL dead band, the current supply is not carried out by the overdrive power supply and the primary internal power supply generating circuit 8 and the high power-supply voltage (SAP) of the sense amplifier 3 decreases heavily. As a result, the amplified voltage difference between the bit line pair BitT/N reduces and a sense time interval becomes longer. Alternatively, a malfunction of the sense amplifier 3 occurs. In the manner which is described above, when the overdrive is carried out at the output of the primary internal power supply generating circuit 8, the VDL dead band where the primary internal power supply generating circuit 8 does not operate occurs at a time when the overdrive comes to an end. It is therefore disadvantageous in that the access time interval becomes longer or the malfunction of the sense amplifier 3 occurs. Accordingly, it is necessary for the internal power supply generating circuit used in the overdrive method to have structure where the VDL dead band does not occur or to have means for suitably controlling the VDL dead band. However, the above-mentioned prior art patent documents 1 to 9 neither describe nor understand a problem for the VDL dead band in the primary internal power supply generating circuit 8 that is founded by the present inventor. Accordingly, inasmuch as the problem is not understood, the above-mentioned prior art patent documents 1 to 9 never teach technique for resolving the problem, as mentioned in the preamble of the instant specification.

FIG. 5 shows the conventional reference voltage generating circuit (subsidiary internal power supply generating circuit) 9 for generating the reference voltage (subsidiary internal power-supply voltage) VRD. The reference voltage generating circuit 9 comprises a current mirror circuit 91, a differential amplifying circuit 92, a driver circuit 93, and a constant current source i2. The subsidiary internal power supply generating circuit 9 has an external input terminal 9a supplied with the external power-supply voltage VEXT, an internal output terminal 9b for producing the subsidiary internal power-supply voltage VRD, and a reference input terminal 9c supplied with a subsidiary reference voltage VRDR.

More specifically, the subsidiary internal power supply generating circuit 9 comprises first and second P-channel MOSFETs P11 and P12, first through third n-channel MOSFETs N11, N12, and N13, and the constant current source i2. The first and the second p-channel MOSFETs P11 and P12 have gates which are connected to each other in common. The first p-channel MOSFET P11 has a drain connected to the gate thereof. That is, the first and the second p-channel MOSFETs P11 and P12 are composed of a pair of mirror transistors. In other words, the current mirror circuit 91 comprises the first and the second p-channel MOSFETs P11 and P12. The first and the second p-channel MOSFETs P11 and P12 have sources which are supplied with the external power-supply voltage VEXT from the external output terminal 9a. The second p-channel MOSFET P12 has a drain. The current mirror circuit 91 has a pair of mirror output nodes 9d and 9e.

The first n-channel MOSFET N11 has a gate supplied with the subsidiary reference voltage VRDR from the subsidiary reference input terminal 9c. The first n-channel MOSFET N11 has a drain connected to the drain and the gate of the first p-channel MOSFET P11. The first n-channel MOSFET N11 serves as a reference differential transistor. The second n-channel MOSFET N12 has a drain connected to the drain of the second n-channel MOSFET P12. The second n-channel MOSFET N12 serves as a feedback differential transistor. The first and the second n-channel MOSFETs N11 and N12 have sources which are connected to each other in common and which are grounded via the constant current source i2. That is, a combination of the first and the second MOSFETs N11 and N12 serves as the differential amplifying circuit 92 connected to the pair of mirror output nodes 9d and 9e.

The third n-channel MOSFET N13 has a gate which is connected to the drain of the second p-channel MOSFET P12 and to the drain of the second n-channel MOSFET N12. The third n-channel MOSFET N13 has a drain supplied with the external power-supply voltage VEXT from the external input terminal 9a. The third n-channel MOSFET N13 has a source which is connected to the gate of the second n-channel MOSFET N12 and to the subsidiary internal output terminal 9b of the subsidiary internal power supply generating circuit 9. The third n-channel MOSFET N13 serves as a driver transistor. That is, the third n-channel MOSFET N13 serves as the driver circuit 93 having a driver control node 9f.

The subsidiary internal power supply generating circuit (the reference voltage generating circuit) 9 generates the subsidiary internal power-supply voltage (the main reference voltage) VRD from the subsidiary internal output terminal 9b.

When the subsidiary internal power-supply voltage (the main reference voltage) VRD becomes high, the second n-channel MOSFET N12 is turned to an on state, and a driver control voltage VRDDG of the driver control node 9f decreases. Inasmuch as the driver control voltage VRDDG decreases, the third n-channel MOSFET N13 is turned off to stop current supply. On the other hand, when the subsidiary internal power-supply voltage (the main reference voltage) VRD becomes low, the driver control voltage VRDDG of the driver control node 9f increases. Inasmuch as the driver control voltage VRDDG increases, current supply from the third n-channel MOSFET N13 becomes much to increase the subsidiary internal power-supply voltage (the main reference voltage) VRD. In the manner which is described above, it is possible to generate the subsidiary internal power-supply voltage (the main reference voltage) VRD as a constant voltage equal to the subsidiary reference voltage VRDR.

Figure 6:
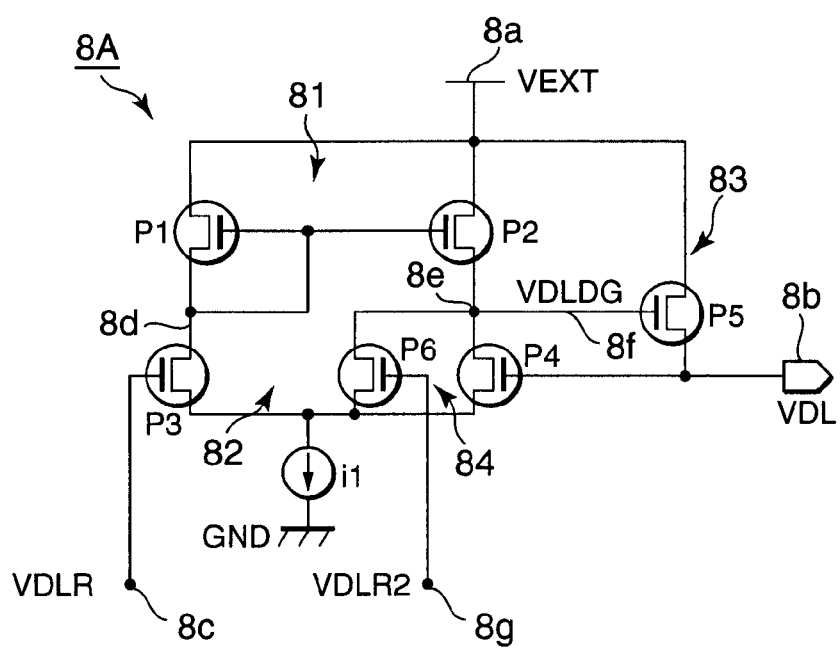
FIG. 6 is a circuit diagram of a primary internal power supply generating circuit according to a first embodiment of this invention.

Referring to FIG. 6, the description will proceed to a primary internal power supply generating circuit 8A according to a first embodiment of this invention. The illustrated primary internal power supply generating circuit 8A is similar in structure and operation to the conventional primary internal power supply generating circuit 8 in FIG. 3 except that the primary internal power supply generating circuit 8A further comprises a control circuit 84 as will later become clear. Similar portions in FIG. 3 are depicted at the same reference symbols.

In the example being illustrated, the control circuit 84 comprises a sixth or regulator transistor P6 which is composed of a P-channel MOSFET. The regulator transistor P6 has a sixth source connected to the driver control node 8f, a sixth gate connected to a second reference input terminal 8g supplied with a second reference voltage VDLR2, and a sixth drain connected to the constant current source i1. That is, the regulator transistor P6 is connected in parallel with the feedback differential transistor P4. The second reference voltage VDLR2 is called an additional reference voltage.

Turning to FIGS. 7A through 7G, description will be made as regards operation of the primary internal power supply generating circuit 8A illustrated in 6.

It will be assumed that the selected word line WL is activated, as shown in FIG. 7A. In this event, a small voltage difference occurs between the bit line pair BitT/N due to a high or low level of the memory cell data, as shown in FIG. 7G. It is herein presumed that the memory cell date has the low level and the voltage difference between the bit line pair BitT/N near to the sense amplifier 3 is shown in FIG. 7G. The sense amplifier 3 is supplied with a high power-supply voltage (SAP) and a low power-supply voltage (SAN) in response to the sense amplifier enable signal SAE and the overdrive signal ODV, as shown in FIGS. 7B and 7C. As the high power-supply voltage (SAP), the external power-supply voltage VEXT is supplied to the sense amplifier 3 in response to the overdrive signal ODV. As the low power-supply voltage (SAN), a ground voltage GND is supplied to the sense amplifier 3.

In this event, the fourth transistor or the feedback differential transistor P4 is put into an off state because the gate voltage of the feedback differential transistor P4 rises to the external power-supply voltage VEXT. However, the second reference voltage VDLR2 is equal to the reference voltage VDLR, as shown in FIG. 7D and the driver control voltage VDLDG at the driver control node 8f is maintained at its voltage level caused by the regulator transistor P6. The driver control voltage VDLDG may decrease by a small amount. By supplying, as the second reference voltage VDLR2, a voltage equal to the reference voltage VDLR, it is possible to maintain the driver control voltage VDLDG at the driver control node 8f to an adequate level thereof. The second reference voltage VDLR2 may be lower than the reference voltage VDLR or may be equal to the ground voltage GND. That is, the regulator transistor P6 for the feedback differential transistor P4 is put into the on state and the driver control voltage VDLDG at the driver control node 8f is maintained to the adequate level. Responsive to the high power-supply voltage (SAP) and the low power-supply voltage (SAN) supplied to the sense amplifier 3, the sense amplifier 3 sharply amplifies the voltage difference between the bit line pair BitT/N. Although the high power-supply voltage (SAP) increases toward the external power-supply voltage VEXT, the high power-supply voltage (SAP) remains at an intermediate voltage between the external power-supply voltage VEXT and the internal power-supply voltage VDL because the sense amplifier 3 is supplied with the current.

At a time when amplification of the voltage difference between the bit line pair BitT/N near to the sense amplifier 3 is almost completed, the overdrive signal ODV is not activated as shown in FIG. 7C and the current supply from the external power supply stops. Subsequently, the second reference voltage VDLR2 is not activated as shown in FIG. 7D and the regulator transistor P6 is turned to the off state. Therefore, the internal power-supply voltage VDL at the internal output terminal 8b decreases. However, inasmuch as the driver control voltage VDLDG at the driver control node 8f has the adequate level (or the level less than that by a small amount), the driver transistor P5 of the primary internal power supply generating circuit 8A is put into the on state and the current can supply from the primary internal power supply generating circuit 8A. In the manner which is described above, at the time instant when the overdrive stops, the current can be supplied from the primary internal power supply generating circuit 8A and it results in occurring no VDL dead band. Inasmuch as the current is supplied from the primary internal power supply generating circuit 8A, variations in the voltage difference between the bit line pair BitT/N is low and amplification operation can be also carried out between a bit line pair BitT/N apart from the sense amplifier 3. It is therefore possible to prevent the sensing duration of the sense amplifier 3 from becoming longer and to prevent the sense amplifier 3 from malfunctioning.

In the first embodiment of this invention, the regulator transistor P6 is added to the primary internal power supply generating circuit 8A to inhibit the rise in the driver control voltage VDLDG for the overdrive duration. Inasmuch as the rise in the control voltage VDLDG is inhibited, the driver transistor P5 is turned on after the overdrive duration and the VDL dead band cannot occur. It is therefore to prevent the sense time interval to delaying and to prevent the sense amplifier 3 to malfunctioning caused by a sharply reduction in the internal power-supply voltage VDL due to the VDL dead band. It is provided with the primary internal power supply generating circuit 8A and the semiconductor device comprising the same which are capable of preventing the sense time interval from delaying and of preventing the sense amplifier 3 from malfunctioning.

Figure 8:
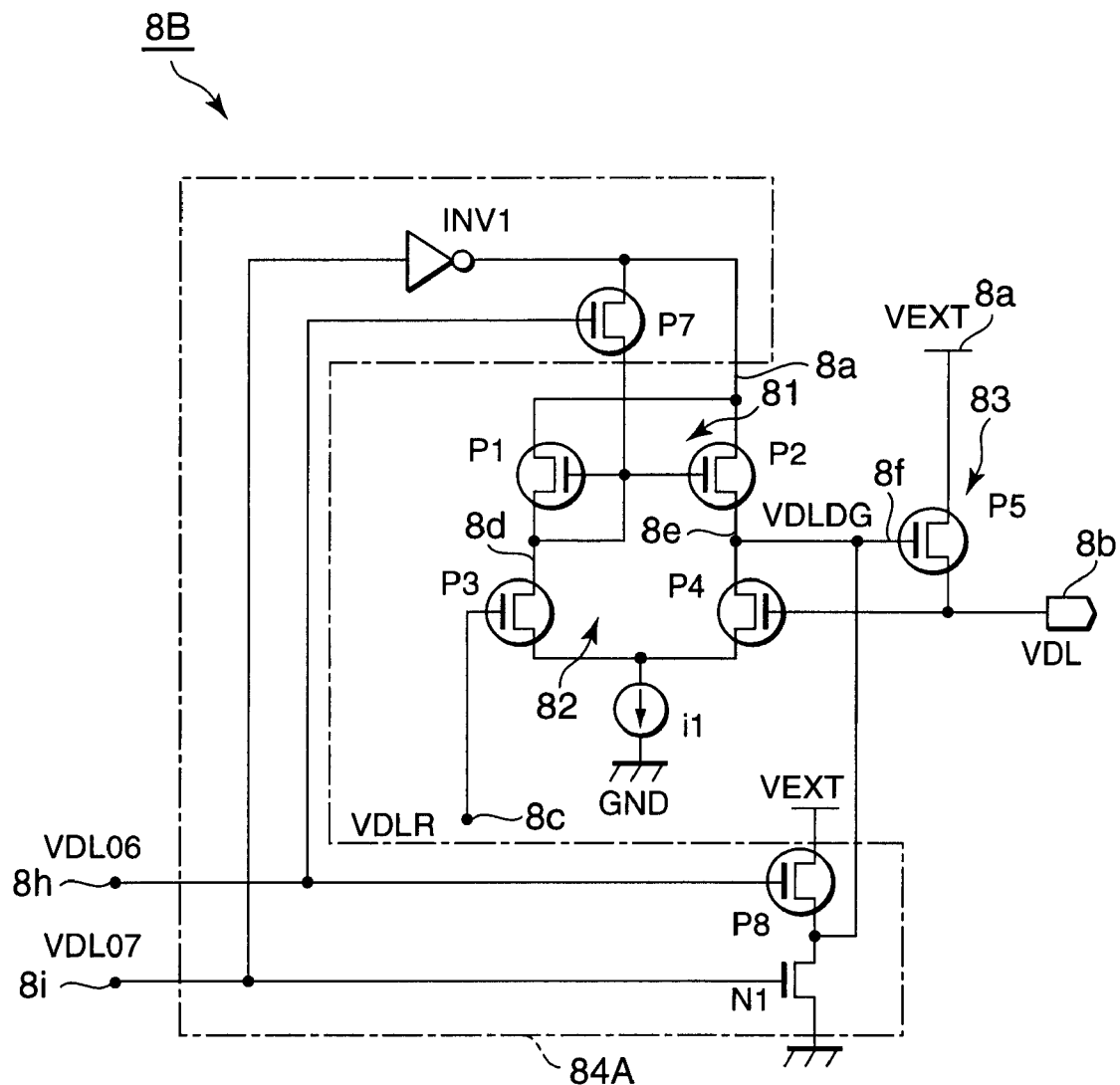
FIG. 8 is a circuit diagram of a primary internal power supply generating circuit according to a second embodiment of this invention.

Referring to FIG. 8, the description will proceed to a primary internal power supply generating circuit 8B according to a second embodiment of this invention. The illustrated internal power supply generating circuit 8B is similar in structure and operation to the conventional primary internal power supply generating circuit 8 in FIG. 3 except that the primary internal power supply generating circuit 8B further comprises a control circuit 84A as will later become clear. Similar portions in FIG. 3 are depicted at the same reference symbols.

In the example being illustrated, the control circuit 84A comprises a logic circuit which comprises transistors P7, P8, an N1 and an inverter circuit INV1. The logic circuit 84A has first and second control terminals 8h and 8i which are supplied with first and second control signals VDL06 and VDL07, respectively.

The inverter circuit INV1 has an input terminal connected to the second control node 8i. The inverter circuit INV1 has an output terminal connected to the sources of the first and the second mirror transistors P1 and P2. The transistor P7 is composed of a P-channel MOSFET The transistor P7 has a gate connected to the first control terminal 8h, a source connected to the output terminal of the inverter circuit INV1, and a drain connected to the gates of the first and the second mirror transistors P1 and P2. The transistor P8 is composed of a P-channel MOSFET. The transistor P8 has a source connected to the external input terminal 8a, a gate connected to the first control terminal 8h, and a drain connected to the driver control node 8f. The transistor N1 is composed of an N-channel MOSFET The transistor N1 has a drain which is connected to the driver control node 8f and to the drain of the transistor P8, a gate connected to the second control terminal 8i, and a source connected to a ground terminal. The inverter circuit INV1 serves as a power supply for the current mirror circuit 81.

Turning to FIGS. 9A through 9I, description will be made as regards operation of the primary internal power supply generating circuit 8B illustrated in FIG. 8.

Figure 9A:
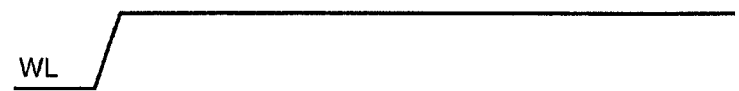
FIGS. 9A through 9I show waveform for use in describing operation of the primary internal power supply generating circuit illustrated in FIG. 8.
Figure 9B:
Figure 9C:
Figure 9D:
Figure 9E:
Figure 9F:

In an initial state, the first and the second control signals VDL06 and VDL07 have a low level as shown in FIGS. 9E and 9F and the internal power-supply voltage VDL is supplied as the reference voltage VDLR as shown in FIG. 9D. Inasmuch as the first control signal VDL06 has the low level, the transistors P7 and P8 are put into an on state and the transistors P1, P2 and P5 are put into an off state. Under the circumstances, the internal power-supply voltage VDL of the internal output terminal 8b holds a voltage level in a previous cycle.

Figure 9G:
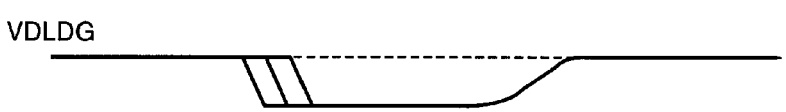
Figure 9H:
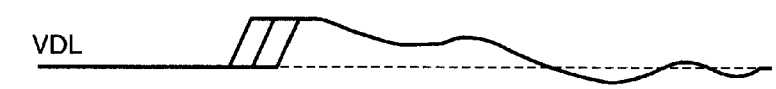
Figure 9I:
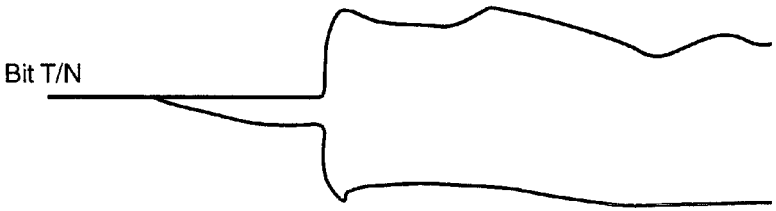

It will be assumed that the selected word line WL is activated. In this event, a small difference voltage occurs between the bit line pair BitT/N due to a high level or a low level in the memory cell data. It will be herein presumed that the memory cell data has the low level and FIG. 9I shows a waveform of the voltage difference between the bit line pair BitT/N near to the sense amplifier 3. In FIGS. 9E through 9H, signals depicted at a plurality of oblique lines indicate that signal inputs are available at any timings within a range thereof with interrelationships thereamong maintained.

When the first control signal VDL06 changes to a high level as shown in FIG. 9E, the transistors P7 and P8 are turned off, and the transistors P1, P2, and P5 are turned on. In this event, the current mirror circuit 81 is put into a normal operation state and the primary internal power supply generating circuit 8B produces the internal power-supply voltage VDL as shown in FIG. 8H. Subsequently, when the second control signal VDL07 changes to a high level, the transistor N1 is turned on, the driver control signal DVLDG of the driver control node 8f is turned to a high level, and the internal power-supply voltage VDL raises toward the external power-supply voltage VEXT. In addition, the inverter circuit INV1 produces an inverted signal having a low level and a power supply to the current mirror circuit 81 stops. Accordingly, during this duration, the power supply is stopped in the current mirror circuit 81 and the internal power-supply voltage VDL raises up to the external power-supply voltage VEXT by the driver transistor P5. However, the sense amplifier enable signal SAE is not activated as shown in FIG. 9B and the overdrive of the external power-supply voltage VEXT to the sense amplifier 3 is not carried out.

Responsive to the sense amplifier enable signal SAE and the overdrive signal ODV, the sense amplifier 3 is supplied with a high power-supply voltage (SAP) and a low power-supply voltage (SAN). As the high power-supply voltage (SAP), the external power-supply voltage VEXT is supplied to the sense amplifier 3 in response to the overdrive signal ODV. As the low power-supply voltage (SAN), the ground voltage GND is supplied to the sense amplifier 3. This overdrive comprises a direct overdrive from the sense amplifier power supply circuit 7 (FIG. 2) and an overdrive from the primary internal power supply generating circuit 8B. Therefore, the direct overdrive from the sense amplifier power supply circuit 7 may be omitted. Responsive to the high power-supply voltage (SAP) and the low power-supply voltage (SAN) supplied to the sense amplifier 3, the sense amplifier 3 sharply amplifies the voltage difference between the bit line pair BitT/N as shown in FIG. 9I.

At a time instant when amplification of the voltage difference between the bit line pair BitT/N comes almost to end, the overdrive signal OVD is not activated as shown in FIG. 9C and a current supply from the external power supply stops. Simultaneously, the second control signal VDL07 changes to a low level as shown in FIG. 9F, the current mirror circuit 81 is supplied with the external power-supply voltage VEXT, and the driver control voltage VDLDG recovers to the adequate level from the low level as shown in FIG. 9G. Inasmuch as the driver control node 8f lies in an operation range when the driver control voltage VDLDG is lower than the adequate level, the driver transistor P5 in the primary internal power supply generating circuit 8B is put into the on stage and the current is supplied from the primary internal power supply generating circuit 8B. In the manner which is described above, at the time instant when the overdrive stops, the driver control voltage VDLDG at the driver control node 8f lies in the on operation range of the driver transistor P5 and it is possible to supply the current from the primary internal power supply generating circuit 8B. As a result, the VDL dead band does not occur.

The primary internal power supply generating circuit 8B according to the second embodiment of the invention controls the driver control voltage VDLDG at the driver control node 8f by the logic circuit 84A. During the overdrive duration, the driver control voltage VDLDG is put into the low level and the internal power-supply voltage VDL is set in the external power-supply voltage VEXT. Inasmuch as the driver control voltage VDLDG lies in the on operation range of the driver transistor P5 after the overdrive come to an end, the driver transistor P5 is turned on and the VDL dead band does not occur. It is therefore possible to prevent the sense time interval from delaying and to prevent the sense amplifier 3 from malfunctioning caused by a sharply voltage reduction of the internal power-supply voltage VDL by the VLD dead band. It is provided with the primary internal power supply generating circuit 8b and the semiconductor device comprising the same which are capable of preventing the sense time interval from delaying and of preventing the sense amplifier 3 from malfunctioning.

Figure 10:
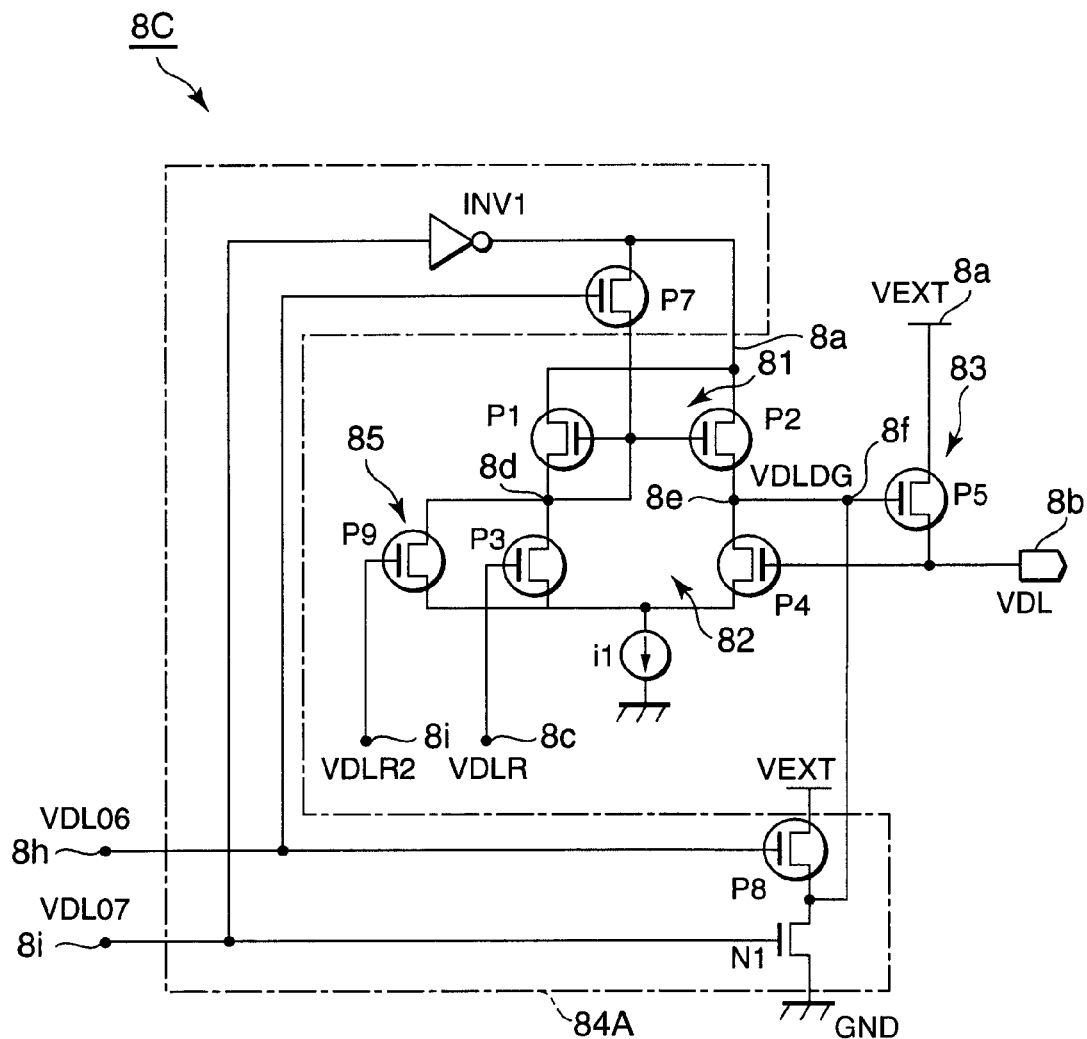
FIG. 10 is a circuit diagram of a primary internal power supply generating circuit according to a third embodiment of this invention.

Referring to FIG. 10, the description will proceed to a primary internal power supply generating circuit 8C according to a third embodiment of this invention. The illustrated primary internal power supply generating circuit 8C is similar in structure and operation to the primary internal power supply generating circuit 8B illustrated in FIG. 8 except that the primary internal power supply generating circuit 8C further comprises a regulator transistor P9 as will later become clear. Similar portions in FIG. 8 are depicted at the same reference symbols.

The semiconductor memory device comprising the primary internal power supply generating circuit 8C carries out, as the overdrive, a first overdrive due to the external power-supply voltage (VEXT) and a second overdrive due to an intermediate voltage (VDL') between the external power-supply voltage (VEXT) and the internal power-supply voltage (VLD).

The regulator transistor P9 is connected in parallel with the reference differential transistor P3. More specifically, the regulator transistor P9 is composed of a P-channel MOSFET. The regulator transistor P9 has a source connected to the source of the reference differential transistor P3, a gate connected to a second reference input terminal 8j supplied with a second reference voltage VDLR2, and a drain connected to the drain of the reference differential transistor P3. The regulator transistor P9 serves as a regulator circuit 85. The second reference voltage VDLR2 is called an additional reference voltage.

Turning to FIGS. 11A through 11J, description will be made as regards operation of the primary internal power supply generating circuit 9C illustrated in FIG. 10.

Figure 11:
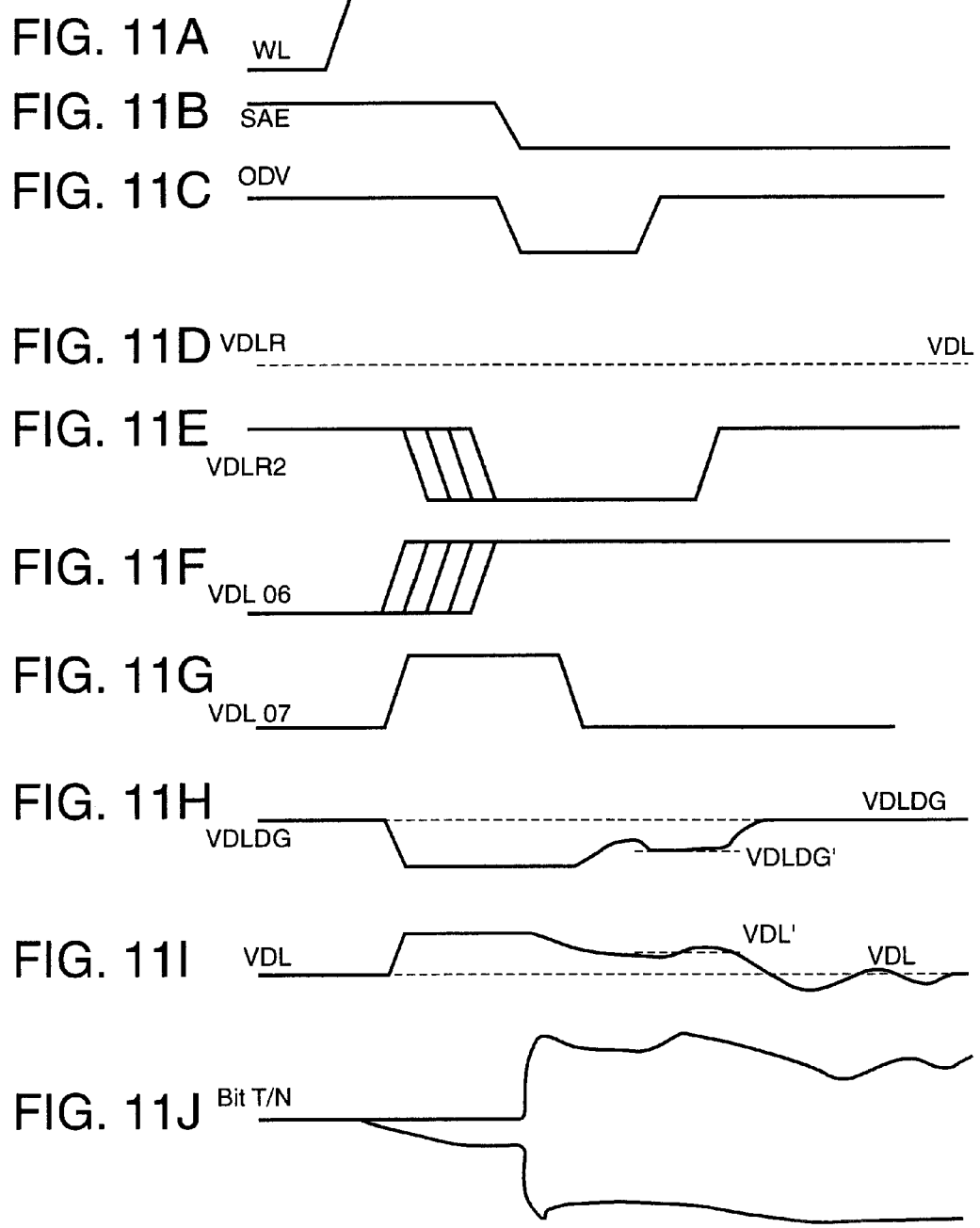
FIGS. 11A through 11J show waveforms for use in describing operation of the primary internal power supply generating circuit illustrated in FIG. 10.

In an initial state, the first and the second control signals VDL06 and VDL07 have a low level as shown in FIGS. 11F and 11G, the internal power-supply voltage VDL is supplied as the reference voltage VDLR as shown in FIG. 11D, and the second reference voltage VDLR2 has a high level as shown in FIG. 11E. Inasmuch as the first control signal VDL06 has the low level, the transistors P7 and P8 are put into an on state and the transistors P1, P2 and P5 are put into an off state. Inasmuch as the second control signal VDL07 has the low level, the transistor N1 is put into an off state and the inverter circuit INV1 produces an inverted signal having a high level to supply the external power-supply voltage VDL to the current mirror circuit 81. Under the circumstances, the internal power-supply voltage VDL of the internal output terminal 8b holds a voltage level in a previous cycle as shown in FIG. 11I.

It will be assumed that the selected word line WL is activated. In this event, a small voltage difference occurs between the bit line pair BitT/N due to a high level or a low level in the memory cell data. It will be herein presumed that the memory cell data has the low level and FIG. 11J shows a waveform of the voltage difference between the bit line pair BitT/N near to the sense amplifier 3.

When both of the first and the second control signals VDL06 and VDL07 change from a low level to a high level as shown in FIGS. 11F and 11G, the transistors P7 and P8 are turned off, and the transistors N1, P1, P2, and P5 are turned on. In this event, a current supply to the current mirror circuit 81 stops. However, inasmuch as the driver control voltage VDLDG at the driver control node 8f has a low level, the primary internal power supply generating circuit 8C produces, as the internal power-supply voltage VDL, the external power-supply voltage VEXT as shown in FIG. 11I. After the first control voltage VDL06 changes to the high level as shown in FIG. 11F, the second reference voltage VDLR2 changes from a high level to a low level as shown in FIG. 11E. In the first control signal VDL06 and the second reference voltage VDLR2, signal inputs are available at any timings within a range of an oblique lines portion with interrelationship therebetween maintained. The first control signal VDL06 and the second reference voltage VDLR2 are signals for setting the current mirror circuit 81 so as to immediately make the current mirror circuit 81 in an operation state after the overdrive comes to an end.

When both of the sense amplifier enable signal SAE and the overdrive signal ODV are turned to a low level from a high level as shown in FIGS. 11B and 11C, the sense amplifier 3 is supplied with a high power-supply voltage (SAP) and a low power-supply voltage (SAN). As the high power-supply voltage (SAP), the external power-supply voltage VEXT is supplied to the sense amplifier 3 in response to the overdrive signal ODV. As the low power-supply voltage (SAN), the ground voltage GND is supplied to the sense amplifier 3. Responsive to the high power-supply voltage (SAP) and the low power-supply voltage (SAN) supplied to the sense amplifier 3, the sense amplifier 3 sharply amplifies the voltage difference between the bit line pair BitT/N as shown in FIG. 11J. Herein, the first overdrive due to the external power-supply voltage VEXT and the second overdrive from the primary internal power-supply generating circuit 8C are carried out.

Inasmuch as the second control signal VDL07 is turned to a low level as shown in FIG. 11G, the transistor N1 is turned off. In addition, responsive to the second control signal VDL07 having the low level, the inverter circuit INV1 produces the inverted signal having a high level, the external power-supply voltage VEXT is supplied to the current mirror circuit 81 and the driver control voltage VDLDG at the driver control node 8f rises as shown in FIG. 11H. However, inasmuch as the second reference voltage VDLR2 has the low level as shown in FIG. 11E, the driver control voltage VDLDG at the driver control node 8f raises up to the intermediate voltage VDLDG' between the low level and the adequate voltage as shown in FIG. 11H. The intermediate voltage VDLDG' lies in the operation range of the driver transistor P5. At a time instant when amplification of the voltage difference between the bit line pair BitT/N comes almost to end, the overdrive signal OVD is not activated as shown in FIG. 11C and the direct or the first overdrive from the external power supply comes to an end. However, inasmuch as the driver transistor P5 is put into the on state, a current is supplied from the primary internal power supply generating circuit 8C. In this event, inasmuch as the regulator transistor P9 is put into an on state in the reference voltage side of the current mirror circuit 81, the driver control voltage VDLDG at the driver control node 8f becomes the intermediate voltage VDLDG' lower than the adequate voltage as shown in FIG. 11H. Therefore, the internal power-supply voltage VDL from the primary internal power supply generating circuit 8C becomes to a voltage VDL' higher than an adequate level thereof as shown in FIG. 11I and the second overdrive is carried out.

At a time instant when amplification of the voltage difference between the bit line pair BitT/N apart from the sense amplifier 3 comes almost to end, the second reference voltage VDLR2 changes to a high level from the low level as shown in FIG. 11E, and the driver control voltage VDLDG and the internal power-supply voltage VDL become to an adequate level thereof as shown in FIGS. 11H and 11I. In the manner which is described above, at a time instant when both of the overdrives from the primary internal power supply generating circuit 8C and the sense amplifier power supply circuit 7 (FIG. 2) stop, the driver control voltage VDLDG lies in the operation range of the driver transistor P5 and therefore the current is supplied from the primary internal power supply generating circuit 8C. In the manner which is described above, the VDL dead band never occurs.

The primary internal power supply generating circuit 8C according to the third embodiment of the invention initializes the driver control voltage VDLDG to the low level before the overdrive. By initializing the driver control voltage VDLDG, it is possible to supply the external power-supply voltage VEXT from also the primary internal power supply generating circuit 8C. Inasmuch as the regulator transistor P9 is added to the reference voltage side, the primary internal power supply generating circuit 8C generates, as the internal power-supply voltage VDL, the voltage VDL' higher than an adequate level thereof and the second overdrive is carried out. Inasmuch as the driver control voltage VDLDG lies in the operation range of the driver transistor P5 after the overdrive duration, the VDL dead band does not occur. It is therefore possible to prevent the sense time interval from delaying and to prevent the sense amplifier 3 from malfunctioning caused by a sharply voltage reduction of the internal power-supply voltage VDL in the VLD dead band. It is provided with the primary internal power supply generating circuit 8C and the semiconductor device comprising the same which are capable of preventing the sense time interval from delaying and of preventing the sense amplifier 3 from malfunctioning.

Figure 12:
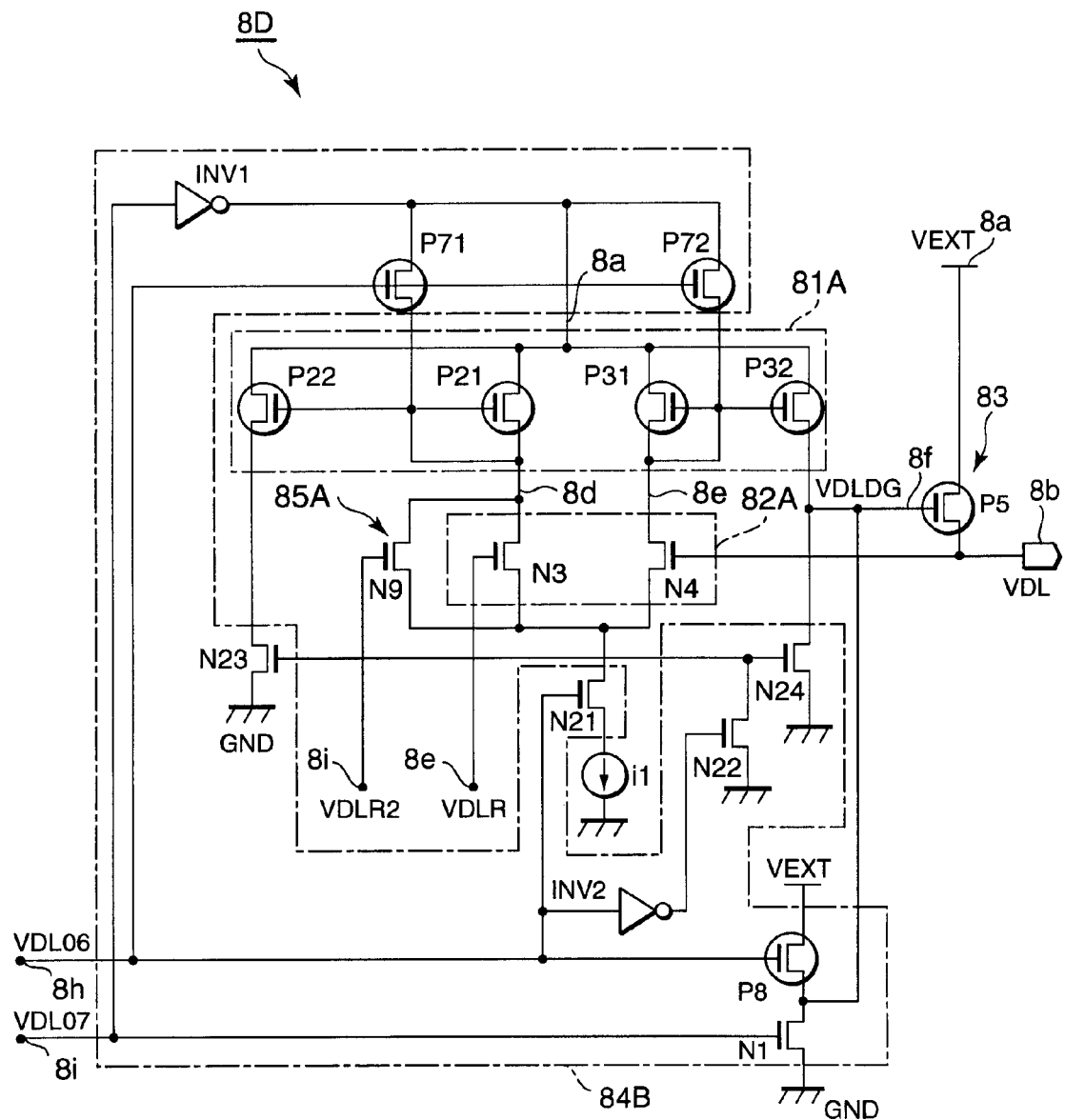
FIG. 12 is a circuit diagram of a primary internal power supply generating circuit according to a fourth embodiment of this invention.

Referring to FIG. 12, the description will proceed to a primary internal power supply generating circuit 8D according to a fourth embodiment of this invention. The illustrated primary internal power supply generating circuit 8D is similar in structure and operation to the primary internal power supply generating circuit 8C illustrated in FIG. 10 except that the current mirror circuit, the differential amplifying circuit, the control circuit, and the regulator circuit are modified from those illustrated in FIG. 10 as will later become clear. The current mirror circuit, the differential amplifying circuit, the control circuit, and the regulator circuit are therefore depicted at 81A, 82A, 84A, and 85A, respectively. Similar portions in FIG. 10 are depicted at the same reference symbols.

The current mirror circuit 81A is a push-pull type current mirror circuit which comprises a first current mirror circuit portion of a reference side and a second current mirror circuit portion of a feedback side in the manner which later become clear. The first current mirror circuit portion is called a reference current mirror circuit while the second current mirror circuit portion is called a feedback current mirror circuit.

The reference current mirror circuit comprises a pair of p-channel MOSFETs P21 and P22. The p-channel MOSFETs P21 and P22 have sources which are connected to each other in common. The p-channel MOSFET P21 has a gate connected to a gate of the p-channel MOSFET P22 and to a drain of the p-channel MOSFET P21. The drain of the p-channel MOSFET P21 is connected to a first one 8d of the pair of mirror output nodes. Similarly, the feedback current mirror circuit comprises another pair of p-channel MOSFETs P31 and P32. The p-channel MOSFETs P31 and P32 have sources which are connected to each other in common. The p-channel MOSFET P31 has a gate connected to a gate of the p-channel MOSFET P32 and to a drain of the p-channel MOSFET P31. The drain of the p-channel MOSFET P31 is connected to a second one 8e of the pair of mirror output nodes. The p-channel MOSFET P32 has a drain connected to the driver control node 8f.

The differential amplifying circuit 82A comprises a pair of differential transistors N3 and N4. Each of the differential transistors N3 and N4 is composed of an n-channel MOSFET. A first one N3 of the pair of differential transistors is called a reference differential transistor while a second one N4 is called a feedback differential transistor. The reference differential transistor N3 has a drain connected to the first one 8*d* of the pair of mirror output nodes. The reference differential transistor N3 has a gate connected to the primary reference input terminal 8*e* supplied with the primary reference voltage VDLR. The reference differential transistor N3 has a source connected to a source of the feedback differential transistor N4. The feedback differential transistor N4 has a drain connected to second one 8*e* of the pair of mirror output nodes. The feedback differential transistor N4 has a gate connected to the internal output terminal 8*b*.

The regulator circuit 85A comprises a regulator transistor N9 which is composed of an n-channel MOSFET. The regulator transistor N9 has a drain connected to the drain of the reference differential transistor N3. The regulator transistor N9 has a source connected to the source of the reference differential transistor N3. The regulator transistor N9 has a gate connected to the second reference input terminal 9*j* supplied with the second reference voltage VDLR2. That is, the regulator transistor N9 is connected in parallel with the reference differential transistor N3.

The control circuit 84B is similar in structure and operation to the control circuit 84A illustrated in FIG. 10 except that the transistor P7 is modified to a pair of transistors P71 and P72 and the control circuit 84B further comprises a second inverter circuit INV2 and four n-channel MOSFETs N21, N22, N23, and N24.

Each of the transistors P71 and P72 is composed of a p-channel MOSFET. The transistor P71 has a gate connected to the first control terminal 8*h*, a source connected to the output terminal of the inverter circuit INV1, and a drain connected to the gates of the p-channel MOSFETs P21 and P22. The transistor P72 has a gate connected to the first control terminal 8*h*, a source connected to the output terminal of the inverter circuit INV1, and a drain connected to the gates of the p-channel MOSFETs P31 and P32.

The n-channel MOSFET N21 is disposed between the differential amplifier circuit 82A and the constant current source i1. Specifically, the n-channel MOSFET N21 has a gate connected to the first control terminal 8*h*, a drain connected to the sources of the differential transistors N3 and N3, and a source connected to the constant current source i1. The second inverter circuit INV2 has an input terminal connected to the first control terminal 8*h*. The n-channel MOSFET N22 has a gate connected an output terminal of the second inverter circuit INV2 and a source connected to the ground terminal GND. The n-channel MOSFET N23 has a gate connected to a drain of the n-channel MOSFET N22, a drain connected to the drain of the p-channel MOSFET N22, and a source connected to the ground terminal GND. The n-channel MOSFET N24 has a gate connected to the drain of the n-channel MOSFET N22, a drain connected to the driver control node 8*f*, and a source connected to the ground terminal GND.

With this structure, the control circuit 84B controls the ground voltage GND in response to the first and the second control signals VDL06 and VDL07. The differential amplifier circuit 85A comprises the N-channel MOSFETs N3 and N4. The driver transistor P5 is composed of the P-channel MOSFET P5. It is therefore necessary to invert levels of the primary reference voltage VDLR and the second reference voltage VDLR2. The primary internal power supply generating circuit 8D carries out a negative feedback operation for the internal power-supply voltage VDL. Although detailed description is omitted, it will be understood for those skilled in the art that the primary internal power supply generating circuit 8D carries out operation similar to that illustrated in FIGS. 11A through 11J.

Figure 13:
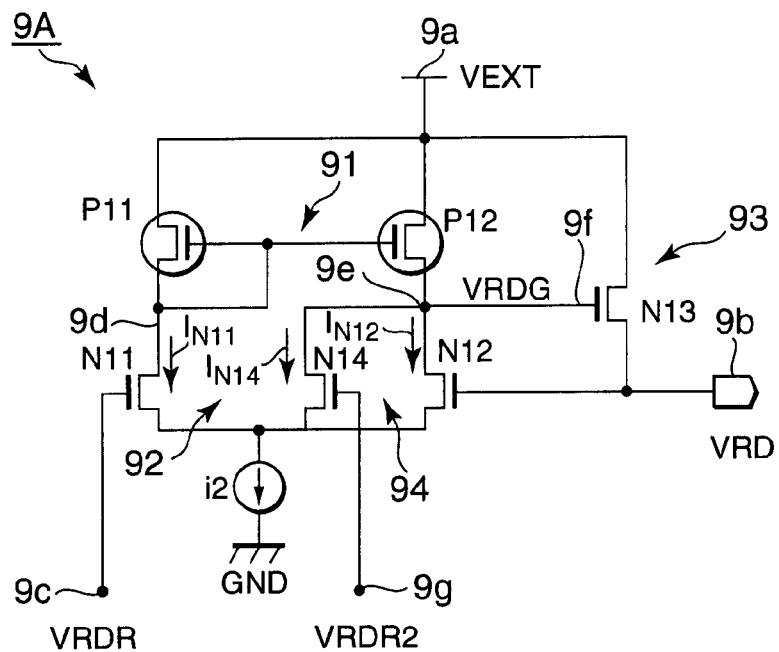
FIG. 13 is a circuit diagram of a subsidiary internal power supply generating circuit according to a fifth embodiment of this invention.

Referring to FIG. 13, the description will proceed to a subsidiary internal power supply generating circuit 9A according to a fifth embodiment of this invention. The illustrated subsidiary internal power supply generating circuit 9A is similar in structure and operation to the conventional subsidiary internal power supply generating circuit 9 illustrated in FIG. 5 except that the subsidiary internal power supply generating circuit 9A further comprises a control circuit 94 as will later become clear. Similar portions in FIG. 5 are depicted at the same reference symbols.

In the example being illustrated, the control circuit 94 comprises a regulator transistor N14 which is composed of an n-channel MOSFET. The regulator transistor N14 has a drain connected to the driver control node 9*f*, a gate connected to a second reference input terminal 9*g* supplied with a second reference voltage VRDR2, and a source connected to the constant current source i2. That is, the regulator transistor N14 is connected in parallel with the feedback differential transistor N12. The second reference voltage VRDR2 is called an additional reference voltage.

In the subsidiary internal power supply generating circuit 9A, it will be assumed that a current $i_{N11}$ flows through the n-channel MOSFET N11, a current $i_{N12}$ flows through the n-channel MOSFET N12, and a current $i_{N14}$ flows through the n-channel MOSFET N14. In addition, it will be assumed that the external power-supply voltage VEXT is supplied as the second reference voltage VRDR2 from the second reference input terminal 9*g*. In a case where the external power-supply voltage VEXT has a middle value VEXT(typ), the subsidiary internal power supply generating circuit 9A is set so that the current $i_{N11}$ flowing through the n-channel MOSFET N11 is equal to a sum of the current $i_{N12}$ flowing through the n-channel MOSFET N12 and the current $i_{N14}$ flowing through the n-channel MOSFET N14 and the subsidiary internal power-supply voltage VRD is equal to the subsidiary reference voltage VRDR.

Under the circumstances, it will be assumed that the external power-supply voltage VEXT has a maximum value VEXT(max) caused by variations of the external power-supply voltage VEXT In this event, the subsidiary internal power-supply voltage VRD is lower than the subsidiary reference voltage VRDR. Conversely, it will be assumed that the external power-supply voltage VEXT has a minimum value VEXT (min) caused by variations of the external power-supply voltage VEXT. In this event, the subsidiary internal power-supply voltage VRD is higher than the subsidiary reference voltage VRDR.

Inasmuch as the second reference voltage VEDR2 is set to the external power-supply voltage VEXT in the manner which is described above, it is possible for the subsidiary internal power supply generating circuit 9A to generate the subsidiary internal power-supply voltage VRD having a reverse dependency on the variations of the external power-supply voltage VEXT. The subsidiary internal power supply generating circuit 9A is advantageous in that it is possible to freely set a power supply circuit having a different dependency on the variations of the external power-supply voltage VEXT in accordance with characteristics required to each circuit in the semiconductor device. For example, it is possible for a delay circuit to use the external power-supply voltage VEXT and the subsidiary internal power-supply voltage (the reference voltage) VRD. Under the circumstances, it will be presumed that the external power-supply voltage VEXT varies in such a direction as to become high. In this event, the delay circuit using the external power-supply voltage VEXT has a shortened delay time interval while the delay circuit using the subsidiary internal power-supply voltage VRD has a lengthened delay time interval. By freely setting those delay time intervals, it is provided with the semiconductor device which is capable of operating at a high speed.

Although detailed description is omitted, it is possible for the subsidiary internal power supply generating circuit 9A to set the second reference voltage VRDR2 supplied to the second reference input terminal 9g as any voltage having a positive dependency on the external power-supply voltage VEXT. Of course, it is possible to generate the subsidiary internal power-supply voltage VRD having a negative dependency on the external power-supply voltage VEXT by supplying the second reference voltage VRDR2 other than the external power-supply voltage VEXT to the second reference input terminal 9g in the manner which is described above. In addition, it is possible for the subsidiary internal power supply generating circuit 9A to obtain a different subsidiary internal power-supply voltage corresponding to the second reference voltage VRDR2 by supplying, as the second reference voltage VRDR2, any different voltages of a pulse fashion.

Figure 14:
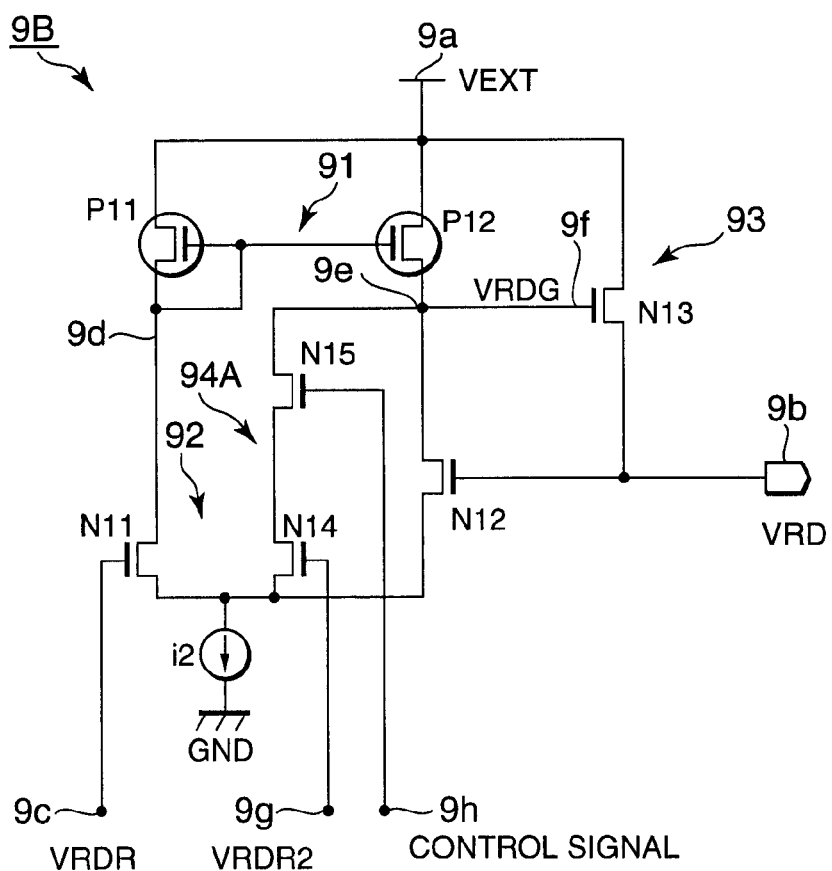
FIG. 14 is a circuit diagram of a subsidiary internal power supply generating circuit according to a sixth embodiment of this invention.

Referring to FIG. 14, the description will proceed to a subsidiary internal power supply generating circuit 9B according to a sixth embodiment of this invention. The illustrated subsidiary internal power supply generating circuit 9B is similar in structure and operation to the subsidiary internal power supply generating circuit 9A illustrated in FIG. 13 except that the control circuit is modified from that illustrated in FIG. 13 as will later become clear. The control circuit is therefore depicted at 94A.

The control circuit 94A comprises not only the regulator transistor N14 but also a control transistor N15. The control transistor N15 is composed of an n-channel MOSFET. The control transistor N15 is disposed between the regulator transistor N14 and the driver control node 9f. Specifically, the control transistor N15 has a drain connected to the driver control node 9f, a source connected to the drain of the regulator transistor N14, and a gate connected to a control input terminal 9h supplied with a control signal. Responsive to the control signal, the control transistor N15 is for controlling connection/disconnection of the regulator transistor N14.

In the fifth and the sixth embodiments of this invention, the description is made as regards the subsidiary internal power supply generating circuits 9A and 9B for generating, as the subsidiary internal power-supply voltage VRD, the primary reference voltage VDLR used in the primary internal power supply generating circuit. It is possible for the subsidiary internal power supply generating circuits 9A and 9B to generate any voltage which is equal to the subsidiary reference voltage VRDR. In addition, by using, as the second reference voltage VRDR2 supplied to the gate of the regulator transistor N14, a voltage having the positive independency on the external power-supply voltage VEXT, it is possible for the subsidiary internal power supply generating circuit to generate the subsidiary internal power-supply voltage VDR having a reverse independency on the variations of the external power-supply voltage VEXT. Although each of the differential transistors, the regulator transistor, and the driver transistor is composed of the n-channel MOSFET in the fifth and the sixth embodiments of this invention, they may be composed of a combination of the p-channel MOSFET and the n-channel MOSFET in the manner which is similar to those in the above-mentioned first through third embodiments of this invention.

In the manner which is described above, it is possible to generate the internal power-supply voltage VRD having the reverse dependency on the variations of the external power-supply voltage VEXT It is possible to freely set a power supply circuit having a different dependency on the variations of the external power-supply voltage VEXT in accordance with a characteristic required to each circuit in the semiconductor devices. For example, it is possible for a delay circuit to use the external power-supply voltage VEXT and the subsidiary internal power-supply voltage VRD. Under the circumstances, it will be presumed that the external power-supply voltage VEXT varies in such a direction as to become high. In this event, the delay circuit using the external power-supply voltage VEXT has a shortened delay time interval while the delay circuit using the subsidiary internal power-supply voltage VRD has a lengthened delay time interval. By freely setting those delay time intervals, it is provided with the semiconductor device which is capable of operating at a high speed.

While this invention has thus far been described in conjunction with a several embodiments thereof, it will readily be possible for those skilled in the art to put this invention into practice in various other manners.

What is claimed is:

1. An internal power supply generating circuit for generating an internal power-supply voltage from an external power-supply voltage, comprising:
   a current mirror circuit having an external input terminal supplied with the external power-supply voltage, said current mirror circuit having a pair of mirror output nodes;
   a differential amplifying circuit connected to the pair of mirror output terminals, said differential amplifying portion having a reference input terminal supplied with a reference voltage and an internal output terminal for producing the internal power-supply voltage;
   a driver circuit connected between the external input terminal and the internal output terminal, said driver circuit having a driver control node connected to said current mirror circuit; and
   a control circuit, connected to the driver control node, for controlling variations of a voltage at the driver control node.

2. The internal power supply generating circuit as claimed in claim 1, said differential amplifying circuit comprising a reference differential transistor having a gate connected to the reference input terminal and a feedback differential transistor having a gate connected to the internal output terminal, wherein said control circuit comprises a regulator transistor connected in parallel with the feedback differential transistor.

3. The internal power supply generating circuit as claimed in claim 2, wherein said regulator transistor has a gate supplied with an additional reference voltage.

4. The internal power supply generating circuit as claimed in claim 3, wherein said variations of the voltage at the driver control node is caused by an overdrive voltage from an output side, said additional reference voltage being equal to the reference voltage for an overdrive duration.

5. The internal power supply generating circuit as claimed in claim 3, wherein said variations of the voltage at the driver control node is caused by an overdrive voltage from an output side, said additional reference voltage being lower than the reference voltage for an overdrive duration.

6. The internal power supply generating circuit as claimed in claim 5, wherein said additional reference voltage is equal to a ground voltage for the overdrive duration.

7. The internal power supply generating circuit as claimed in claim 3, wherein said additional reference voltage is equal to the external power-supply voltage.

8. The internal power supply generating circuit as claimed in claim 1, wherein said control circuit comprises a logic circuit connected to said driver control node, said logic circuit setting said driver control node within an operation range of said driver circuit at a time when an overdrive comes to an end.

9. The internal power supply generating circuit as claimed in claim 8, wherein said control circuit does not supply said current mirror circuit with the external power-supply voltage for an overdrive duration.

10. The internal power supply generating circuit as claimed in claim 8, said differential amplifying circuit comprising a reference differential transistor having a gate connected to the reference input terminal and a feedback differential transistor having a gate connected to the internal output terminal, wherein said internal power supply generating circuit further comprises a regulator transistor connected in parallel with the reference differential transistor.

11. The internal power supply generating circuit as claimed in claim 10, wherein said regulator transistor has a gate supplied with an additional reference voltage.

12. A semiconductor memory device comprising:
a plurality of memory cell arrays each of which comprises a plurality of memory cells in a matrix fashion, each memory cell array having a plurality of bit line pairs and a plurality of word lines;
a plurality of sense amplifier rows each of which comprises a plurality of sense amplifiers connected to the plurality of bit line pairs;
a plurality of word line columns each of which comprises a plurality of word drivers for driving the plurality of word lines;
an internal power supply generating circuit for generating an internal power-supply voltage from an external power-supply voltage; and
a sense amplifier power supply circuit connected to the sense amplifier rows and to said internal power supply generating circuit, said sense amplifier power supply circuit supplying, as an overdrive voltage, the external power-supply voltage to the sense amplifier rows for an overdrive duration, said sense amplifier power supply circuit supplying the internal power-supply voltage to the sense amplifier rows after the overdrive duration,
wherein said internal power supply generating circuit comprises:
a current mirror circuit having an external input terminal supplied with the external power-supply voltage, said current mirror circuit having a pair of mirror output nodes;
a differential amplifying circuit connected to the pair of mirror output terminals, said differential amplifying portion having a reference input terminal supplied with a reference voltage and an internal output terminal for producing the internal power-supply voltage;
a driver circuit connected between the external input terminal and the internal output terminal, said driver circuit having a driver control node connected to said current mirror circuit; and
a control circuit, connected to the driver control node, for controlling variations of a voltage at the driver control node.

13. The semiconductor memory device as claimed in claim 12, said differential amplifying circuit comprising a reference differential transistor having a gate connected to the reference input terminal and a feedback differential transistor having a gate connected to the internal output terminal, wherein said control circuit comprises a regulator transistor connected in parallel with the feedback differential transistor.

14. The semiconductor memory device as claimed in claim 13, wherein said regulator transistor has a gate supplied with an additional reference voltage.

15. The semiconductor memory device as claimed in claim 14, wherein said variations of the voltage at the driver control node is caused by the overdrive voltage from an output side, said additional reference voltage being equal to the reference voltage for the overdrive duration.

16. The semiconductor memory device as claimed in claim 14, wherein said variations of the voltage at the driver control node is caused by the overdrive voltage from an output side, said additional reference voltage being lower than the reference voltage for the overdrive duration.

17. The semiconductor memory device as claimed in claim 16, wherein said additional reference voltage is equal to a ground voltage for the overdrive duration.

18. The semiconductor memory device as claimed in claim 12, wherein said control circuit comprises a logic circuit connected to said driver control node, said logic circuit setting said driver control node within an operation range of said driver circuit after the completion of the overdrive duration.

19. The semiconductor memory device as claimed in claim 18, wherein said control circuit does not supply said current mirror circuit with the external power-supply voltage for the overdrive duration.

20. The semiconductor memory device as claimed in claim 18, said differential amplifying circuit comprising a reference differential transistor having a gate connected to the reference input terminal and a feedback differential transistor having a gate connected to the internal output terminal, wherein said internal power supply generating circuit further comprises a regulator transistor connected in parallel with the reference differential transistor.

21. The semiconductor memory device as claimed in claim 20, wherein said regulator transistor has a gate supplied with an additional reference voltage.

* * * * *